(12) United States Patent
Lu et al.

(10) Patent No.: US 7,858,965 B2
(45) Date of Patent: Dec. 28, 2010

(54) NANOWIRE HETEROSTRUCTURES

(75) Inventors: Wei Lu, Ann Arbor, MI (US); Jie Xiang, Pasadena, CA (US); Yue Wu, El Cerrito, CA (US); Brian P. Timko, Cambridge, MA (US); Hao Yan, Cambridge, MA (US); Charles M. Lieber, Lexington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 449 days.

(21) Appl. No.: 11/807,186

(22) Filed: May 25, 2007

(65) Prior Publication Data

US 2008/0191196 A1 Aug. 14, 2008

Related U.S. Application Data

(63) Continuation-in-part of application No. PCT/US2005/034345, filed on Sep. 21, 2005.

(60) Provisional application No. 60/687,807, filed on Jun. 6, 2005.

(51) Int. Cl.
*H01L 29/778* (2006.01)
(52) U.S. Cl. .............................. 257/24; 257/19; 257/20; 257/E29.07; 257/194
(58) Field of Classification Search ..................... 257/24
See application file for complete search history.

(56) References Cited

U.S. PATENT DOCUMENTS 3,444,100 A 5/1969 Mayer
3,873,359 A 3/1975 Lando (Continued)

FOREIGN PATENT DOCUMENTS

| CN | 1110786 | 10/1995 |
|---|---|---|
| EP | 0 622 439 A1 | 4/1994 |
| EP | 1 087 413 A2 | 3/2001 |
| EP | 1170799 | 1/2002 |
| JP | 7-326603 | 12/1995 |

(Continued)

OTHER PUBLICATIONS

Yu et al, J. Phys. Chem. B 2000, 104, pp. 11864-11870. "Silicon Nanowires . . . Properties".*

(Continued)

*Primary Examiner*—Jerome Jackson, Jr.
(74) *Attorney, Agent, or Firm*—Wolf, Greenfield & Sacks, P.C.

(57) ABSTRACT

The present invention generally relates to nanoscale heterostructures and, in some cases, to nanowire heterostructures exhibiting ballistic transport, and/or to metal-semiconductor junctions that that exhibit no or reduced Schottky barriers. One aspect of the invention provides a solid nanowire having a core and a shell, both of which are essentially undoped. For example, in one embodiment, the core may consist essentially of undoped germanium and the shell may consist essentially of undoped silicon. Carriers are injected into the nanowire, which can be ballistically transported through the nanowire. In other embodiments, however, the invention is not limited to solid nanowires, and other configurations, involving other nanoscale wires, are also contemplated within the scope of the present invention. Yet another aspect of the invention provides a junction between a metal and a nanoscale wire that exhibit no or reduced Schottky barriers. As a non-limiting example, a nanoscale wire having a core and a shell may be in physical contact with a metal electrode, such that the Schottky barrier to the core is reduced or eliminated. Still other aspects of the invention are directed to electronic devices exhibiting such properties, and techniques for methods of making or using such devices.

11 Claims, 12 Drawing Sheets

U.S. PATENT DOCUMENTS

| | | | |
|---|---|---|---|
| 3,873,360 A | 3/1975 | Lando | |
| 3,900,614 A | 8/1975 | Lando | |
| 4,673,474 A | 6/1987 | Ogawa | |
| 4,939,556 A | 7/1990 | Eguchi et al. | |
| 5,023,139 A | 6/1991 | Birnboim et al. | |
| 5,089,545 A | 2/1992 | Pol | |
| 5,252,835 A | 10/1993 | Lieber et al. | |
| 5,274,602 A | 12/1993 | Glenn | |
| 5,332,910 A | 7/1994 | Haraguchi et al. | |
| 5,453,970 A | 9/1995 | Rust et al. | |
| 5,475,341 A | 12/1995 | Reed | |
| 5,512,131 A | 4/1996 | Kumar et al. | |
| 5,524,092 A | 6/1996 | Park | |
| 5,537,075 A | 7/1996 | Miyazaki | |
| 5,539,214 A | 7/1996 | Lynch et al. | |
| 5,574,306 A | 11/1996 | Wang et al. | |
| 5,581,091 A | 12/1996 | Moskovits et al. | |
| 5,589,692 A | 12/1996 | Reed | |
| 5,607,876 A | 3/1997 | Biegelsen et al. | |
| 5,620,850 A | 4/1997 | Bamdad et al. | |
| 5,640,343 A | 6/1997 | Gallagher et al. | |
| 5,726,524 A | 3/1998 | Debe | |
| 5,739,057 A | 4/1998 | Tiwari et al. | |
| 5,747,180 A | 5/1998 | Miller et al. | |
| 5,751,156 A | 5/1998 | Muller et al. | |
| 5,776,748 A | 7/1998 | Singhvi et al. | |
| 5,824,470 A | 10/1998 | Baldeschwieler et al. | |
| 5,830,538 A | 11/1998 | Gates et al. | |
| 5,840,435 A | 11/1998 | Lieber et al. | |
| 5,847,565 A | 12/1998 | Narayanan | |
| 5,858,862 A | 1/1999 | Westwater et al. | |
| 5,864,823 A | 1/1999 | Levitan | |
| 5,866,434 A | 2/1999 | Massey et al. | |
| 5,882,779 A | 3/1999 | Lawandy | |
| 5,897,945 A | 4/1999 | Lieber et al. | |
| 5,900,160 A | 5/1999 | Whitesides et al. | |
| 5,903,010 A | 5/1999 | Flory et al. | |
| 5,908,692 A | 6/1999 | Hamers et al. | |
| 5,916,642 A | 6/1999 | Chang | |
| 5,942,443 A | 8/1999 | Parce et al. | |
| 5,985,173 A | 11/1999 | Gray et al. | |
| 5,997,832 A | 12/1999 | Lieber et al. | |
| 6,004,444 A | 12/1999 | Aksay et al. | |
| 6,036,774 A | 3/2000 | Lieber et al. | |
| 6,038,060 A | 3/2000 | Crowley | |
| 6,060,121 A | 5/2000 | Hidber et al. | |
| 6,060,724 A | 5/2000 | Flory et al. | |
| 6,069,380 A | 5/2000 | Chou et al. | |
| 6,123,819 A | 9/2000 | Peeters | |
| 6,128,214 A | 10/2000 | Kuekes et al. | |
| 6,143,184 A | 11/2000 | Martin et al. | |
| 6,149,819 A | 11/2000 | Martin et al. | |
| 6,159,742 A | 12/2000 | Lieber et al. | |
| 6,180,239 B1 | 1/2001 | Whitesides et al. | |
| 6,187,165 B1 | 2/2001 | Chien et al. | |
| 6,190,634 B1 | 2/2001 | Lieber et al. | |
| 6,203,864 B1 | 3/2001 | Zhang et al. | |
| 6,207,392 B1 | 3/2001 | Weiss et al. | |
| 6,211,464 B1 | 4/2001 | Mochizuki et al. | |
| 6,231,744 B1 | 5/2001 | Ying et al. | |
| 6,248,674 B1 | 6/2001 | Kamins et al. | |
| 6,256,767 B1 | 7/2001 | Kuekes et al. | |
| 6,270,074 B1 | 8/2001 | Rasmussen et al. | |
| 6,278,231 B1 | 8/2001 | Iwasaki et al. | |
| 6,286,226 B1 | 9/2001 | Jin | |
| 6,287,765 B1 | 9/2001 | Cubicciotti | |
| 6,314,019 B1 | 11/2001 | Kuekes et al. | |
| 6,325,904 B1 | 12/2001 | Peeters | |
| 6,340,822 B1 | 1/2002 | Brown et al. | |
| 6,346,189 B1 | 2/2002 | Dai et al. | |
| 6,355,198 B1 | 3/2002 | Kim et al. | |
| 6,359,288 B1 | 3/2002 | Ying et al. | |
| 6,361,861 B2 | 3/2002 | Gao et al. | |
| 6,437,329 B1 | 8/2002 | Yedur et al. | |
| 6,440,637 B1 | 8/2002 | Choi et al. | |
| 6,451,113 B1 | 9/2002 | Givargizov | |
| 6,459,095 B1 | 10/2002 | Heath et al. | |
| 6,465,132 B1 | 10/2002 | Jin | |
| 6,468,657 B1 | 10/2002 | Hou et al. | |
| 6,468,677 B1 | 10/2002 | Benton et al. | |
| 6,479,028 B1 | 11/2002 | Kaner et al. | |
| 6,503,375 B1 | 1/2003 | Maydan et al. | |
| 6,528,020 B1 | 3/2003 | Dai et al. | |
| 6,538,367 B1 | 3/2003 | Choi et al. | |
| 6,559,468 B1 | 5/2003 | Kuekes et al. | |
| 6,586,095 B2 | 7/2003 | Wang et al. | |
| 6,624,420 B1 | 9/2003 | Chai et al. | |
| 6,628,053 B1 | 9/2003 | Den et al. | |
| 6,716,409 B2 | 4/2004 | Hafner et al. | |
| 6,741,019 B1 | 5/2004 | Filas et al. | |
| 6,743,408 B2 | 6/2004 | Lieber et al. | |
| 6,749,827 B2 | 6/2004 | Smalley et al. | |
| 6,756,025 B2 | 6/2004 | Colbert et al. | |
| 6,756,795 B2 | 6/2004 | Hunt et al. | |
| 6,762,056 B1 | 7/2004 | Peeters | |
| 6,781,166 B2 | 8/2004 | Lieber et al. | |
| 6,803,840 B2 | 10/2004 | Hunt et al. | |
| 6,808,746 B1 | 10/2004 | Dai et al. | |
| 6,815,706 B2 | 11/2004 | Li et al. | |
| 6,846,565 B2 | 1/2005 | Korgel et al. | |
| 6,872,645 B2 | 3/2005 | Duan et al. | |
| 6,882,051 B2 | 4/2005 | Majumdar et al. | |
| 6,882,767 B2 | 4/2005 | Yang et al. | |
| 6,900,479 B2 | 5/2005 | DeHon et al. | |
| 6,902,720 B2 | 6/2005 | McGimpsey | |
| 6,946,197 B2 | 9/2005 | Yadav et al. | |
| 6,958,216 B2 | 10/2005 | Kelley et al. | |
| 6,962,823 B2 | 11/2005 | Empedocles et al. | |
| 6,963,077 B2 | 11/2005 | DeHon et al. | |
| 6,974,706 B1 | 12/2005 | Melker et al. | |
| 6,996,147 B2 | 2/2006 | Majumdar et al. | |
| 7,048,903 B2 | 5/2006 | Colbert et al. | |
| 7,073,157 B2 | 7/2006 | DeHon et al. | |
| 7,112,315 B2 | 9/2006 | Kiang | |
| 7,129,554 B2 | 10/2006 | Lieber et al. | |
| 7,172,953 B2 | 2/2007 | Lieber et al. | |
| 7,211,464 B2 | 5/2007 | Lieber et al. | |
| 7,254,151 B2 | 8/2007 | Lieber et al. | |
| 7,256,466 B2 | 8/2007 | Lieber et al. | |
| 7,274,208 B2 | 9/2007 | DeHon et al. | |
| 7,301,199 B2 | 11/2007 | Lieber et al. | |
| 7,303,875 B1 | 12/2007 | Bock et al. | |
| 7,335,908 B2 | 2/2008 | Samuelson et al. | |
| 7,385,267 B2 | 6/2008 | Lieber et al. | |
| 7,399,691 B2 | 7/2008 | Lieber et al. | |
| 7,476,596 B2 | 1/2009 | Lieber et al. | |
| 7,500,213 B2 | 3/2009 | DeHon et al. | |
| 7,595,260 B2 | 9/2009 | Lieber et al. | |
| 7,619,290 B2 | 11/2009 | Lieber et al. | |
| 2001/0051367 A1 | 12/2001 | Kiang | |
| 2001/0054709 A1 | 12/2001 | Heath et al. | |
| 2002/0013031 A1 | 1/2002 | Chen et al. | |
| 2002/0040805 A1 | 4/2002 | Swager | |
| 2002/0055239 A1 | 5/2002 | Tuominen et al. | |
| 2002/0084502 A1 | 7/2002 | Jang et al. | |
| 2002/0086335 A1 | 7/2002 | Massey et al. | |
| 2002/0112814 A1 | 8/2002 | Hafner et al. | |
| 2002/0117659 A1 | 8/2002 | Lieber et al. | |
| 2002/0122766 A1 | 9/2002 | Lieber et al. | |
| 2002/0130311 A1 | 9/2002 | Lieber et al. | |
| 2002/0130353 A1 | 9/2002 | Lieber et al. | |
| 2002/0146714 A1 | 10/2002 | Lieber et al. | |
| 2002/0158342 A1 | 10/2002 | Tuominen et al. | |
| 2002/0172820 A1 | 11/2002 | Majumdar et al. | |

| | | |
|---|---|---|
| 2002/0175408 A1 | 11/2002 | Majumdar et al. |
| 2002/0179434 A1 | 12/2002 | Dai et al. |
| 2002/0187504 A1 | 12/2002 | Reich et al. |
| 2003/0001091 A1 | 1/2003 | Nakayama et al. |
| 2003/0003300 A1 | 1/2003 | Korgel et al. |
| 2003/0032892 A1 | 2/2003 | Erlach et al. |
| 2003/0048619 A1 | 3/2003 | Kaler et al. |
| 2003/0073071 A1 | 4/2003 | Fritz et al. |
| 2003/0089899 A1 | 5/2003 | Lieber et al. |
| 2003/0098488 A1 | 5/2003 | O'Keeffe et al. |
| 2003/0113713 A1 | 6/2003 | Glezer et al. |
| 2003/0113940 A1 | 6/2003 | Erlanger et al. |
| 2003/0121764 A1 | 7/2003 | Yang et al. |
| 2003/0124509 A1 | 7/2003 | Kenis et al. |
| 2003/0124717 A1 | 7/2003 | Awano et al. |
| 2003/0134267 A1 | 7/2003 | Kang et al. |
| 2003/0134433 A1 | 7/2003 | Gabriel et al. |
| 2003/0135971 A1 | 7/2003 | Liberman et al. |
| 2003/0156992 A1 | 8/2003 | Anderson et al. |
| 2003/0186522 A1 | 10/2003 | Duan |
| 2003/0186544 A1 | 10/2003 | Matsui et al. |
| 2003/0189202 A1 | 10/2003 | Li et al. |
| 2003/0197456 A1 | 10/2003 | Den et al. |
| 2003/0200521 A1 | 10/2003 | DeHon et al. |
| 2004/0005723 A1 | 1/2004 | Empedocles et al. |
| 2004/0026684 A1 | 2/2004 | Empedocles |
| 2004/0067530 A1 | 4/2004 | Gruner |
| 2004/0075464 A1 | 4/2004 | Samuelson et al. |
| 2004/0095658 A1 | 5/2004 | Buretea et al. |
| 2004/0106203 A1 | 6/2004 | Stasiak et al. |
| 2004/0112964 A1 | 6/2004 | Empedocles et al. |
| 2004/0113138 A1 | 6/2004 | DeHon et al. |
| 2004/0113139 A1 | 6/2004 | DeHon et al. |
| 2004/0118448 A1 | 6/2004 | Scher et al. |
| 2004/0136866 A1 | 7/2004 | Pontis et al. |
| 2004/0146560 A1 | 7/2004 | Whiteford et al. |
| 2004/0157414 A1 | 8/2004 | Gole et al. |
| 2004/0188721 A1 | 9/2004 | Lieber et al. |
| 2004/0191517 A1 | 9/2004 | Drake |
| 2004/0213307 A1 | 10/2004 | Lieber et al. |
| 2005/0037374 A1 | 2/2005 | Melker et al. |
| 2005/0064185 A1 | 3/2005 | Buretea et al. |
| 2005/0064731 A1 | 3/2005 | Park et al. |
| 2005/0066883 A1 | 3/2005 | Dubrow et al. |
| 2005/0072213 A1 | 4/2005 | Besnard et al. |
| 2005/0079533 A1 | 4/2005 | Samuelson et al. |
| 2005/0079659 A1 | 4/2005 | Duan et al. |
| 2005/0100960 A1 | 5/2005 | Dai et al. |
| 2005/0101026 A1 | 5/2005 | Sailor et al. |
| 2005/0109989 A1 | 5/2005 | Whiteford et al. |
| 2005/0110064 A1 | 5/2005 | Duan et al. |
| 2005/0117441 A1 | 6/2005 | Lieber et al. |
| 2005/0161662 A1 | 7/2005 | Majumdar et al. |
| 2005/0181587 A1 | 8/2005 | Duan et al. |
| 2005/0201149 A1 | 9/2005 | Duan et al. |
| 2005/0202615 A1 | 9/2005 | Duan et al. |
| 2005/0212079 A1 | 9/2005 | Stumbo et al. |
| 2005/0214967 A1 | 9/2005 | Scher et al. |
| 2005/0219788 A1 | 10/2005 | Chow et al. |
| 2005/0230356 A1 | 10/2005 | Empedocles et al. |
| 2005/0253137 A1 | 11/2005 | Whang et al. |
| 2005/0266662 A1 | 12/2005 | Yi |
| 2005/0287717 A1 | 12/2005 | Heald et al. |
| 2006/0008942 A1 | 1/2006 | Romano et al. |
| 2006/0009003 A1 | 1/2006 | Romano et al. |
| 2006/0019472 A1 | 1/2006 | Pan et al. |
| 2006/0054936 A1 | 3/2006 | Lieber et al. |
| 2006/0057360 A1 | 3/2006 | Samuelson et al. |
| 2006/0160246 A1 | 7/2006 | Massey et al. |
| 2006/0175601 A1 | 8/2006 | Lieber et al. |
| 2006/0237749 A1 | 10/2006 | Lieber et al. |
| 2006/0269927 A1 | 11/2006 | Lieber et al. |
| 2007/0026645 A1 | 2/2007 | Lieber et al. |
| 2007/0032023 A1 | 2/2007 | Lieber et al. |
| 2007/0032051 A1 | 2/2007 | Lieber et al. |
| 2007/0032052 A1 | 2/2007 | Lieber et al. |
| 2007/0048492 A1 | 3/2007 | Lieber et al. |
| 2007/0158766 A1 | 7/2007 | Lieber et al. |
| 2007/0252136 A1 | 11/2007 | Lieber et al. |
| 2007/0281156 A1 | 12/2007 | Lieber et al. |
| 2008/0161876 A1 | 7/2008 | Wirbisky et al. |
| 2008/0191196 A1 | 8/2008 | Lu et al. |
| 2008/0211040 A1 | 9/2008 | Lieber et al. |
| 2008/0254291 A1 | 10/2008 | Dehon et al. |
| 2009/0004852 A1 | 1/2009 | Lieber et al. |
| 2009/0057650 A1 | 3/2009 | Lieber et al. |

FOREIGN PATENT DOCUMENTS

| | | |
|---|---|---|
| JP | 09-191104 | 10/1996 |
| JP | 10-167893 | 6/1998 |
| JP | 11-11917 A2 | 1/1999 |
| JP | 2000-31462 A | 1/2000 |
| JP | 2001/281965 | 10/2001 |
| WO | WO 91/06036 A1 | 5/1991 |
| WO | WO 95/02709 A2 | 1/1995 |
| WO | WO 96/28538 | 9/1996 |
| WO | WO 96/29629 A2 | 9/1996 |
| WO | WO 97/32571 | 3/1997 |
| WO | WO 97/34140 | 3/1997 |
| WO | WO 97/33737 A1 | 9/1997 |
| WO | WO 97/34025 A1 | 9/1997 |
| WO | WO 98/39250 A1 | 9/1998 |
| WO | WO 98/42620 A1 | 10/1998 |
| WO | WO 98/48456 A1 | 10/1998 |
| WO | WO 99/24823 | 11/1998 |
| WO | WO 99/63347 A2 | 12/1999 |
| WO | WO 00/09443 A1 | 2/2000 |
| WO | WO 00/17101 A1 | 3/2000 |
| WO | WO 00/19494 A1 | 4/2000 |
| WO | WO 00/29617 A3 | 5/2000 |
| WO | WO 00/51186 A2 | 8/2000 |
| WO | WO 01/03208 A1 | 1/2001 |
| WO | WO 01/44796 | 6/2001 |
| WO | WO 02/17362 A2 | 2/2002 |
| WO | WO 02/31183 A1 | 4/2002 |
| WO | WO 02/48701 A2 | 6/2002 |
| WO | WO 02/080280 A1 | 10/2002 |
| WO | WO 02/086480 A1 | 10/2002 |
| WO | WO 03/005450 A2 | 1/2003 |
| WO | WO 03/016901 A1 | 2/2003 |
| WO | WO 03/053851 A2 | 7/2003 |
| WO | WO 03/054931 A1 | 7/2003 |
| WO | WO 03/063208 A2 | 7/2003 |
| WO | WO 2004/003535 A1 | 1/2004 |
| WO | WO 2004/010552 A1 | 1/2004 |
| WO | WO 2004/032190 A2 | 4/2004 |
| WO | WO 2004/032193 A2 | 4/2004 |
| WO | WO 2004/034025 A2 | 4/2004 |
| WO | WO 2004/038767 A2 | 5/2004 |
| WO | WO 2005/114282 A2 | 2/2005 |
| WO | WO 2005/089165 A2 | 9/2005 |
| WO | WO 2005/093831 A1 | 10/2005 |
| WO | WO 2005/094440 A2 | 10/2005 |
| WO | WO 2005/119753 A2 | 12/2005 |
| WO | WO 2006/107312 | 10/2006 |
| WO | WO 2006/132659 | 12/2006 |
| WO | WO 2007/044034 | 4/2007 |
| WO | WO 2007/145701 A2 | 12/2007 |
| WO | WO 2008/027078 A2 | 3/2008 |
| WO | WO 2008/033303 A2 | 3/2008 |
| WO | WO 2008/123869 A2 | 10/2008 |

WO WO 2008/127314 A1 10/2008

OTHER PUBLICATIONS

Cui et al, Nanoletters 2003, vol. 3 No. 2 pp. 149-152, High Performance . . . Transistors.Pub. on the web Jan. 1, 2003.*
Australian Office Action from application No. AU 2002229046 dated Jun. 21, 2005.
Japanese Office Action from application No. JP 2002-549958 dated Sep. 18, 2007.
Japanese Office Action from application No. JP 2002-549958 dated Apr. 16, 2008.
European Office Action from application No. EP 02759070.2 dated Jun. 30, 2005.
European Office Action from application No. EP 02759070.2 dated Dec. 16, 2008.
Korean Office Action from application No. KR 10-2008-7013814 dated Sep. 17, 2008.
Korean Office Action from application No. KR 10-2008-7013814 dated Mar. 30, 2009.
Korean Office Action from application No. KR 10-2008-7013814 dated Aug. 29, 2009.
Japanese Office Action from application No. JP 2003-511316 dated Mar. 7, 2008.
Japanese Office Action from application No. JP 2003-511316 dated Dec. 5, 2008.
Korean Office Action from application No. KR 10-2003-7002636 dated Jun. 25, 2007.
Korean Office Action from application No. KR 10-2008-7028931 dated Feb. 10, 2009.
Korean Office Action from application No. KR 10-2008-7028931 dated Aug. 31, 2009.
Chinese Office Action from application No. CN 200610139984.7 dated Nov. 7, 2008.
Korean Office Action from application No. KR 10-2007-7030228 dated Mar. 24, 2008.
Australian Office Action from application No. AU 2001286649 dated Jul. 20, 2005.
Australian Office Action from application No. AU 2001286649 dated Jul. 26, 2006.
Australian Office Action from application No. AU 2001286649 dated Jan. 17, 2007.
Korean Office Action from application No. KR 10-2008-7027974 dated Feb. 10, 2009.
Korean Office Action from application No. KR 10-2008-7027974 dated Aug. 31, 2009.
Korean Office Action from application No. KR 10-2009-7007374 dated Jul. 10, 2009.
Korean Office Action from application No. KR 10-2003-7007723 dated Aug. 31, 2007.
European Office Action from application No. EP 01990181.8 dated Nov. 7, 2006.
European Office Action from application No. EP 01990181.8 dated Mar. 2, 2004.
European Office Action from application No. EP 01990181.8 dated Jul. 21, 2005.
Australian Office Action from application No. AU 2002324426 dated Feb. 28, 2006.
Australian Office Action from application No. AU 2002324426 dated Aug. 8, 2006.
Australian Office Action from application No. AU 2002324426 dated Feb. 22, 2007.
Australian Office Action from application No. AU 2007211919 dated Oct. 27, 2008.
Korean Office Action from application No. KR 10-2007-7019497 dated Oct. 23, 2007.
Korean Office Action from application No. KR 10-2007-7019497 dated Feb. 21, 2008.
Korean Office Action from application No. KR 10-2007-7019497 dated May 29, 2008.
Canadian Office Action from application No. CA 2,417,992 dated Feb. 23, 2009.
Australian Office Action from application No. AU 2007202897 dated May 14, 2009.
Chinese Office Action from application No. CN 01816168.5 dated Sep. 2, 2005.
Chinese Office Action from application No. CN 01816168.5 dated Apr. 21, 2006.
Chinese Office Action from application No. CN 01816168.5 dated Oct. 20, 2006.
Chinese Office Action from application No. CN 01816168.5 dated Apr. 10, 2009.
European Office Action from application No. EP 01966109.9 dated Jun. 24, 2009.
Korean Office Action from application No. KR 10-2007-7028031 dated Oct. 24, 2008.
U.S. Office Action from U.S. Appl. No. 11/824,618 dated Jun. 29, 2009.
Korean Office Action from application No. KR 10-2007-7030228 dated Dec. 28, 2009.
Korean Office Action from application No. KR 10-2008-7015375 dated Dec. 28, 2009.
Smalley, E. "Biochip Spots Single Viruses" The Latest Technology Research News, Oct. 20/27, 2004.
Office Action from U.S. Appl. No. 11/543,352 dated Sep. 12, 2008.
Office Action from U.S. Appl. No. 11/543,746 dated Sep. 8, 2008.
Office Action from U.S. Appl. No. 11/543,336 dated Jun. 18, 2008.
Office Action from U.S. Appl. No. 11/543,353 dated Oct. 6, 2008.
Office Action from U.S. Appl. No. 11/543,326 dated Oct. 14, 2008.
International Search Report and Written Opinion from PCT Application PCT/US2007/013700 dated May 29, 2008.
International Search Report and Written Opinion from PCT Application PCT/US2007/019669 dated Jan. 24, 2008.
International Search Report and Written Opinion from PCT Application PCT/US2007/024222 dated Oct. 10, 2008.
International Search Report and Written Opinion from PCT Application PCT/US2007/024126 dated Sep. 26, 2008.
Patolsky, Fernando et al. "Nanowire-Based Biosensors" Analytical Chemistry, Jul. 1, 2006, pp. 4261-4269.
Shi, Y. et al. "Long Si Nanowires With Millimeter-Scale Length by Modified Thermal Evaporation From Si Powder" Appl. Phys. A 80, 1733-1736 (2005).
Wang, D. et al. "Rational Growth of Branched and Hyperbranched Nanowire Structures" Nano Letters, 2004, vol. 4, No. 5, pp. 871-874.
Wu, et al., "Germanium/carbon core-sheath nanostructures," Applied Physics Letters, vol. 77, No. 1, pp. 43-45 (2000).
Yu, J. et al. "One-Dimensional Silicon Nanostructures Fabricated by Thermal Evaporation" Materials Science & Engineering C26 (2006), pp. 800-804.
Zhang, Y.F. et al. "Bulk-Quantity Si Nanowires Synthesized by SiO Sublimation" Journal of Crystal Growth, 212 (2000) pp. 115-118.
Agarwal, et al., "Lasing in Single Cadmium Sulfide Nanowire Optical Cavities," Nano-Lett, 5(5):917-920 (2005).
Chen, "Noncovalent functionalization of carbon nanotubes for highly specific electronic biosensors," PNAS, 100(9):4984-4989 (2003).
Chen, J., et al., "Large On-Off Ratios and Negative Differential Resistance in a Molecular Electronic Device," Science, 286: 1550-51 (1999).
Cheung, C.L., et al., "Diameter Controlled Synthesis of Carbon Nanotubes," J. Phys. Chem B, 106, (2002), pp. 2429-2433.
Choi, "Enhancement of Ferroelectricity in Strained $BaTiO_3$ Thin Films," Science, 306:1005-1009 (2004).
Chung, et al., "Silicon nanowire devices", Appl Phys Lett, 76(15): 2068-2070 (2000).
Collier, C.P., et al., "Electronically Configurable Molecular-Based Logic Gates", SCIENCE, vol. 285, Jul. 16, 1999, pp. 391-394.
Cui et al., "Nanowire nanosensors for highly sensitive and selective detection of biological and chemical species", Science, Aug. 17, 2001, vol. 293, pp. 1289-1292.
Cui, Yi, et al. "Doping and Electrical Transport in Silicon Nanowires", The Journal of Physical Chemistry, vol. 104, No. 22, Jun. 8, 2000, pp. 5213-5216.

Cui, Yi, et al., "Diameter-controlled synthesis of single-crystal silicon nanowires", *Applied Physics Letters*, vol. 78, No. 15, Apr. 9, 2001, pp. 2214-2216.

Cui, Yu, et al., "Functional Nanoscale Electronic Devices Assembled Using Silicon Nanowire Building Blocks",*SCIENCE*, vol. 291, Feb. 2, 2001, pp. 851-853.

Duan, "Synthesis and optical properties of gallium arsenide nanowires," *Apl Phys Lett*, 76(9):1116-1118 (2000).

Duan, X., et al., "High-performance thin-film transistors using semiconductor nanowires and nanoribbons", *Nature*, 425: 274-278 (2003).

Duan, X., et al., "Nonvolatile Memory and Programmable Logic from Molecule-Gated Nanowires," *Nano Letters*, 2(5), (2002), pp. 487-490.

Duan, X., et al., "Single-nanowire electrically driven lasers," *Nature*, 421, (2003), pp. 241-245.

Duan, Xiangfeng, et al., "General Synthesis of Compound Semiconductor Nanowires", *Adv. Materials. 2000*, 12, No. 4, pp. 298-302, published on Web Feb. 17, 2000.

Duan, Xiangfeng, et al., "Indium phosphide nanowires as building blocks for nanoscale electronic and optoelectronic devices", *Nature*, vol. 409, Jan. 4, 2001, pp. 66-69.

Duan, Xiangfeng, et al., "Laser-Assisted Catalytic Growth of Single Crystal GaN Nanowires", *J. Am. Chem. Soc. 2000*, 122, Oct. 18, 1999, pp. 188-189; published on Web Dec. 18, 1999.

Esfarjani, K., et al., "Electronic and transport properties of N-P doped nanotubes", *Appl Phy Lett*, 74(1): 79-81 (1999).

Friedman, "High-speed integrated nanowire circuits," *Nature*, 434:1085 (2005).

Givargizov, E.I., et al., "Fundamental Aspects of VLS Growth," *J. Crystal Growth*, 31, (1975), pp. 20-30.

Gradecak, "GaN nanowire lasers with low lasing thresholds," *Apl Phys Lett*, (87): 173111-173111-3 (2005).

Gudiksen et al., "Growth of nanowire superlattice structures for nanoscale photonics and electronics", *Nature*, 2002, vol. 415, pp. 617-620.

Gudiksen, M.S., et al., "Size-Dependent Photoluminescence from Single Indium Phosphide Nanowires," *J. Phys. Chem. B*, 106, (2002), pp. 4036-4039.

Gudiksen, M.S., et al., "Synthetic Control of the Diameter and Length of Single Crystal Semiconductor Nanowires," *J. Phys. Chem. B*, 105, (2001), pp. 4062-4064.

Gudiksen, Mark S., et al. "Diameter-Selective Synthesis of Semiconductor Nanowires", *J. Am. Chem. Soc. 2000*, 122, Jun. 6, 2000, pp. 8801-8802.

Guo, et al., "Nanoscale Silicon Field Effect Transistors Fabricated Using Imprint Lithography," *Appl Phys Lett*, 71(13):1881-1883; (1997).

Guo, L., et al., "A Silicon Single-Electron Transistor Memory Operating at Room Temperature," *Science*, 275: 649-651 (1997).

Hahm, "Direct Ultrasensitive Electrical Detection of DNA and DNA Sequence Variations Using nanowire Nanosensors," *Nano-Lett*, 4(1):51-54 (2003).

Haraguchi et al, "Polarization dependence of light emitted from GaAs p-n junctions in quantum wire crystals", *Journal of Applied Physics*, Apr. 1994, vol. 75, No. 8, pp. 4220-4225.

Haraguchi, et al., "GaAs p-n junction formed in quantum wire crystals", *Appl Phys Lett*, 60: 745-747 (1992).

Heath, "A liquid solution synthesis of single crystal germanium quantum wires," *Chem Phys Lett*, 208(3,4):263-265 (1993).

Hiruma, "GaAs free-standing quantum-size wires," *J Apl Phys*, 74(5):3162 -3171 (1993).

Hiruma, K., et al., "Self-organized growth of GaAs/InAs heterostructure nanocylinders by organometallic vapor phase epitaxy," *J. Crystal Growth*, 163, (1996), pp. 226-231.

Holmes, et al., Control of Thickness and Orientation of Solution-Grown Silicon Nanowires, Science, 287, (2000), pp. 1471-1473.

Hsu, S.T., et al. "Mfmox Ferroelectric Memory Transistor," Non-Volatile Memory Technology Symposium, Orlando, Fl, Nov. 15-17, 2004, p. 24-27.

Hu, J "Serpentine Superlattice nanowire-Array Lasers," *Quant Elec*, 31(8):1380-1388 (1995).

Hu, J., et al., "Chemistry and Physics in One Dimension: Synthesis and Properties of Nanowires and Nanotubes," *Acc. Chem. Res.*, 32, (1999), pp. 435-445.

Hu, J., et al., "Controlled growth and electrical properties of heterojunctions of carbon nanotubes and silicon nanowires," *Nature*, 399, (1999), pp. 48-51.

Hu, S.-Y., "Serpentine Superlattice Nanowire-Array Lasers, "*J. Quant. Electron.*, 31(8), (1995), pp. 1380-1388.

Huang, et al., "Logic Gates and Computation from Assembled Nanowire Building Blocks", *Science*, 294: 1313-1317 (2001).

Huang, M., et al., "Room-Temperature Ultraviolet Nanowire Nanolasers," *Science*, 292, (2001), pp. 1897-1898.

Huang, Y., et al., "Gallium Nitride Nanowire Nanodevices," *Nano Letters*, 2(2), (2002), pp. 101-104.

Huang, Yu, et al., "Directed Assembly of One-dimensional Nanostructures into Functional Networks", Science, vol. 291, Jan. 26, 2001, pp. 630-633.

"IBM creates highest performing nanotube transistors", IBM News, 2002.

Javey, A., Ballistic Carbon Nanotube Field-Effect Transistors, *Nature*, 424:654-657 (2003) [S:].

Jin, "Scalable Interconnection and Integration of Nanowire Devices without Registration," *Nano-Lett*, 4(5):915-919 (2004).

Johnson, J.C., et al., "Single gallium nitride nanowire lasers," *Nature Materials*, 1, (2002), pp. 106-110.

Johnson, J.C., et al., "Single Nanowire Lasers," *J. Phys. Chem.*, 105(46), (2001), pp. 11387-11390.

Joselevich, E., et al., "Vectorial Growth of Metallic and Semiconducting Single-Wall Carbon Nanotubes," *Nano Letters*, 2(10), (2002), pp. 1137-1141.

Kanjanachuchai et al., "Coulomb blockade in strained-Si nanowires on leaky virtual substrates", *Semiconductor Science and Technology*, 2001, vol. 16, pp. 72-76.

Kong et al. "Nanotube molecular wires as chemical sensors", *Science*, Jan. 28, 2000, vol. 287, pp. 622-625.

Kong, J., et al., "Chemical vapor deposition of methane for single-walled carbon nanotubes," *Chem. Physics Letters*, 292, (1998), pp. 567-574.

Kong, J., et al., "Synthesis of individual single-walled carbon natubes on patterned silicon wafers," *Nature*, 395, (1998), pp. 878-881.

Lahoun et al., "Epitaxial core-shell and core-multishell nanowire heterostructures", *Nature*, 2002, vol. 420, pp. 57-61.

Lahoun, L.J. et al., "Semiconductor nanowire heterostructures," 2004, *Phil. Trans. R. Soc. Lond.*, 362: 1247-1260 (2004).

Law, "Nanoribbon Waveguides for Subwavelength Photonics Integration," *Science*, 305(27):1269-1273 (2004).

Leff, "Thermodynamic Control of Gold Nanocrystal Size: Experiment and Theory," *J Phys Chem*, 99:7036-7041 (1995).

Lei, "Nanowire transistors with ferroelectric gate dielectrics: Enhanced performance and memory effects," *Apl Phys Lett*, 84(22): 4553-4555 (2004).

Lieber, "Nanoscale Science and Technology: Building a Big Future from Small Things," *MRS Bull*, www.mrs.org/publications/bulletin (2003).

Lieber, "Nanowire Superlattices," *Nanoletters*, 2(2):81-82 (2002).

Lu, W. et al., "One-dimensional hole gas in germanium/silicon nanowire heterostructures," *PNAS*, 102:10046-10051 (2005).

Martel, R., et al., "Single- and multi-wall carbon nanotube field-effect transistors," *Apl Phys Lett*, 73(17), (1998), pp. 2447-2449.

McAlpine, "High-Performance Nanowire Electronics and Photonics and Nanoscale Patterning on Flexible Plastic Substrates," *Proc IEEE*, 93(7):1357-1363 (2005).

McAlpine, M. "High-Performance Nanowire Electronics and Photonics on Glass and Plastic Substrates", *Nano Letters*, 3(11): 1531-1535 (2003).

McAlpine, M., "Nanoimprint Lithography for Hybrid Plastic Electronics", *Nano-Letters*, 3(4): 443-445 (2003).

Menon, "Fabrication and Evaluation of Nanoelectrode Ensembles," *Anal Chem*, 67(13):1920-1928 (1995).

Mizutani, T., "Fabrication and Characterization of Carbon Nanotube FETs," Quantum Sensing and Nanophotonic Devices II, M. Flazeghi, G.J. Brown, Ed., Proc SPIE, vol. 5732, p. 28-36.

Morales, et al., "A Laser Ablation Method for the Synthesis of Crystalline Semiconductor Nanowires", *Science*, 279: 208-211 (1998).
Musin, R. N., "Structural and Electronic Properties of Epitaxial Core-Shell Nanowire Heterostructures," *Phys. Rev. B*, 71:155318.
Nosho, Y., "n-type Carbon Nanotube Field-Effect Transistors Fabricated by Using Ca Contact Electrodes," Appl. Phys. Lett., 86:73105.
Padeste, et al., "Modular amperometric immunosensor devices", 1995, *8th International Conference on Solid-State Sensors an Actuators and Eurosensors IX*, 357(C7): 487-490 (1995).
Patolsky, "Electrical detection of single viruses," *PNAS*, 101(39):14017-14022 (2004).
Patolsky, "Nanowire nanosensors," *Mat Today*, 1369(7021): 20-28 (2005).
Pavesi, "Optical gain in silicon nanocrystals," *Nature*, 408:440-444 (2000).
Qi, "Toward Large Arrays of Multiplex Functionalized Carbon Nanotube Sensors for Highly Sensitive and Selective Molecular Detection," *Nano-Lett*, 3(3):347-351 (2003).
Rueckes, T., et al., "Carbon Nanotube-Based Nonvolatile Random Access Memory for Molecular Computing," *Science*, 298, (2000), pp. 94-97.
Star et al., "Preparation and properties of polymer-wrapped single-walled carbon nanotubes", *Angew. Chem. Int.*, 2001, vol. 40, No. 9, pp. 1721-1725.
Takayama, S., et al., "Patterning cells and their environments using multiple laminar fluid flows in capillary networks", *Proc. Natl. Acad. Sci.*, 96: 5545-5548 (1999).
Tans, et al., "Room-temperature transistor based on a single carbon nanotube", *Nature*, 393: 49-52 (1998).
Thess, A., et al., "Cyrstalline Ropes of Metallic Carbon Nanotubes," *Science*, 273, (1996), pp. 483-487.
Tiefenauer, et al., "Towards Amperometric Immunosensor Devices" *Biosensors and Bioelectronics*, 12(3): 213-223 (1997).
Tong, "Subwavelength-diameter silica wires for low-loss optical wave guiding," *Nature*, 426(18):816-819 (2003).
Urban, "Single-Crystalling Barium Titanate Nanowires," *Adv Mat*, 15(5):423-426 (2003).
Vossmeyer, T. et al., "Combinatorial approaches toward patterning nanocrystals," Journal of Applied Physics, 1998, 84(7):3664-3670.
Wang et al., "Highly polarized photoluminescence and photodetection from single indium phosphide nanowires", *Science*, 2001, vol. 293, pp. 1455-1457.
Wang, "Label-free detection of small-molecule-protein interactions by using nanowire nanosensors," *PNAS*, 102(9):3208-3212 (2005).
Wang, N., et al., "$SiO_2$-enhanced synthesis of Si nanowires by laser ablation," *App. Physics Letters*, 73(26), (1998), pp. 3902-3904.
Wei, Q., et al., "Synthesis of Single Crystal Bismuth-Telluride and Lead-Telluride Nanowires for New Thermoelectric Materials," *Mat. Res. Soc. Symp. Proc.*, 581, (2000), pp. 219-223.
Whang, "Large-Scale Hierarchical Organization of Nanowire Arrays for Integrated Nanosystems," *Nano-Lett*, 3(9):1255-1259 (2003).
Whang, "Nanolithographys Using Hierarchically Assembled Nanowire Masks," *Nano-Lett*, 3(7):951-954 (2003).
Wolf, et al., "Silicon Processing for the VLSI ERA", Lattice Press, 1:12-13 (2000).
Wong, S., et al., "Covalently funtionalized nanotubes as nanometre-sized probes in chemistry and biology," *Nature*, 394, (1998), pp. 52-55.
Wu et al., "Block-by-block growth of single-crystalline Si/SiGe superlattice nanowires", web release date, Jan. 19, 2002, http://pubs.acs.org/hotartcl/nalefd/2002/nl0156888_rev.html.
Wu, "Controlled Growth and Structures of Molecular-Scale Silicon Nanowires," *Nano-Lett*, 4(3):433-436 (2004).
Wu, "Single-crystal metallic nanowires and metal/semiconductor nanowire heterostructures," *Nature*, 430:61-65 (2004).
Xiang, "Ge/Si nanowire heterostructures as high-performance field-effect transistors," *Nature*, 441:489-493 (2006).
Yamada, Y., "Analysis of submicron carbon nanotube field-effect transistors", *Appl Phys Lett*, 76: (5): 628-630 (2000).
Yang, "Wires on water," *Nature*, 425:243-244 (2003).
Yang, P. et al., "Controlled Growth of ZnO Nanowires and Their Optical Properties," *Adv. Funct. Matter*, 12(5), (2002), pp. 323-331.

Yu, et al., "Nanoscale silicon wires synthesized using simple physical evaporation", *Appl Phys Lett*, 72 (26): 3458-3460 (1998).
Yun, W.S., et al., "Ferroelectric Properties of Individual Barium Titanate Nanowires Investigated by Scanned Probe microscopy," *Nano Letters*, vol. 2, No. 5, p. 447-450 (2002).
Zheng, "Multiplexed electrical detection of cancer markers with nanowire sensor arrays," *Nature Biotech*, 23(10):1294-1301 (2005).
Zheng, "Synthesis and Fabrication of High-Performance n-Type Silicon Nanowire Transistors," *Adv Matt*, 16(21):1890-1893 (2004).
Zhong, "Coherent Single Charge Transport in Molecular-Scale Silicon Nanowires," *Nano-Lett*, 5(6):1143-1146 (2005).
Zhong, "Nanowire Crossbar Arrays as Address Decoders for Integrated Nanosystems," *Science*, 302:1377-1379 (2003).
Zhong, "Synthesis of p-Type Gallium Nitride Nanowires for Electronic and Photonic Nanodevices," *Nano-Lett*, 3(3):343-346 (2003).
Zhou, G., et al., "Growth morphology and micro-structural aspects of Si nanowires synthesized by laser ablation," *J. of Crystal Growth*, 197, (1999), pp. 129-135.
International Preliminary Exam. Report from Int. Apl. No. PCT/US01/48230, filed Dec. 11, 2001.
International Preliminary Exam. Report from Int. Apl. No. PCT/US2005/020974, filed Jun. 15, 2005.
International Search Report from Int. Apl. No. PCT/US01/48230, filed Dec. 11, 2001.
International Search Report from Int. Apl. No. PCT/US02/16133, field May 20, 2002.
International Search Report from Int. Apl. No. PCT/US03/22061, filed Jul. 16, 2003.
International Search Report from Int. Apl. No. PCT/US03/22753, filed Jul. 21, 2003.
International Search Report from Int. Apl. No. PCT/US2005/004459, filed Feb. 14, 2005.
International Search Report from Int. Apl. No. PCT/US2005/020974, filed Jun. 15, 2005.
International Search Report from Int. Apl. No. PCT/US2005/026759, filed Jul. 28, 2005.
International Search Report from Int. Apl. No. PCT/US2005/034345, filed Nov. 21, 2005.
Invitation to Pay Addition Fees from Int. Apl. No. PCT/US2005/044212, filed Dec. 6, 2005.
Office Action mailed Jan. 3, 2005 in U.S. Appl. No. 10/196,337, filed Jul. 16, 2002.
Office Action mailed Jan. 15, 2003 in U.S. Appl. No. 10/020,004, filed Dec. 11, 2001.
Office Action mailed Feb. 23, 2006 in U.S. Appl. No. 10/196,337, filed Jul. 16, 2002.
Office Action mailed Mar. 11, 2005 in U.S. Appl. No. 09/935,776, filed Aug. 22, 2001.
Office Action mailed Mar. 14, 2005 in U.S. Appl. No. 10/020,004, filed Dec. 11, 2001.
Office Action mailed Apr. 7, 2006 in U.S. Appl. No. 10/734,086, filed Dec. 11, 2003.
Office Action mailed Apr. 23, 2007 in U.S. Appl. No. 11/582,167, filed Oct. 17, 2006.
Office Action mailed May 16, 2006 in U.S. Appl. No. 09/935,776, filed Aug. 22, 2001.
Office Action mailed May 25, 2005 in U.S. Appl. No. 10/196,337, filed Jul. 16, 2002.
Office Action mailed Jun. 25, 2004 in U.S. Appl. No. 10/020,004, filed Dec. 11, 2001.
Office Action mailed Jun. 30, 2004 in U.S. Appl. No. 10/196,337, filed Jul. 16, 2002.
Office Action mailed Aug. 30, 2005 in U.S. Appl. No. 09/935,776, filed Aug. 22, 2001.
Office Action mailed Aug. 30, 2005 in U.S. Appl. No. 10/020,004, filed Dec. 11, 2001.
Office Action mailed Sep. 2, 2003 in U.S. Appl. No. 09/935,776, filed Aug. 22, 2001.
Office Action mailed Sep. 15, 2004 in U.S. Appl. No. 09/935,776, filed Aug. 22, 2001.
Office Action mailed Oct. 27, 2006 in U.S. Appl. No. 10/734,086, filed Dec. 11, 2003.

Office Action mailed Nov. 2, 2006 in U.S. Appl. No. 10/196,337, filed Jul. 16, 2002.
Office Action mailed Nov. 29, 2005 in U.S. Appl. No. 10/995,075, filed Nov. 22, 2004.
Office Action mailed Dec. 20, 2006 in U.S. Appl. No. 11/012,549, filed Dec. 15, 2004.
Written Opinion from Int. Apl. No. PCT/US01/48230, filed Dec. 11, 2001.
Written Opinion from Int. Apl. No. PCT/US2005/004459, filed Feb. 14, 2005.
Written Opinion from Int. Apl. No. PCT/US2005/020974, filed Jun. 15, 2005.
Written Opinion from Int. Apl. No. PCT/US2005/026759, filed Jul. 28, 2005.
Written Opinion from Int. Apl. No. PCT/US2005/034345, filed Nov. 21, 2005.
Office Action from U.S. Appl. No. 11/543,337 mailed Jun. 25, 2009.
Office Action from U.S. Appl. No. 11/543,746 mailed Jul. 8, 2009.
Office Action from U.S. Appl. No. 11/543,353 mailed May 22, 2009.
Office Action from U.S. Appl. No. 11/543,326 mailed Mar. 5, 2009.
Office Action from U.S. Appl. No. 12/038,794 mailed Mar. 6, 2009.
Office Action from U.S. Appl. No. 11/386,080 mailed Apr. 3, 2009.
Office Action from U.S. Appl. No. 11/172,408 mailed Dec. 29, 2008.
Lieber, "Covalent Ceramics III-Science and Technology of Non-Oxides" *Mat Res Soc Symp Proc* 410:103 (1995).
MacBeath et al. "Printing Proteins as Microarrays for High-Throughput Function Determination", *Science* 289, 1760 (2000).
Mitchell et al. "Smart Nanotubes for Bioseparations and Biocatalysis" *JACS* 124:11864-11865 (2002).
Neuman et al. "Microarray profiling of antiviral antibodies for the development of diagnostics, vaccines, and therapeutics", *Clin Immunol* 111: 196-201 (2004).
Smalley "Biochip spots single viruses", *Late Tech Res News* (Oct. 20, 2004).
Balavoine, F. et al., "Helical Crystalization of Proteins on Carbon Nanotubes: A First Step towards the Development of New Biosensors," *Angew. Chem. Int. Ed*, vol. 38, No. 13/14, pp. 1912-1915 (1999).
Fagan, S. et al. "*Ab initio* calculations for a hypothetical material: Silicon nanotubes," *Physical Review B*, vol. 61, No. 15, pp. 9994-9996 (2000).
Jensen, K. et al. "Kinetics for Hybridization of Peptide Nucleic Acids (PNA) with DNA and RNA Studied with the BIAcore Technique," *Biochemistry*, vol. 36, pp. 5072-5077 (1997).
Li, Z. et al., "Sequence-Specific Label-Free DNA Sensors Based on Silicon Nanowires," *Nano Letters*, vol. 4, No. 2, pp. 245-247 (2004).
Li, C.Z. et al., "Fabrication of stable metallic nanowires with quantized conductance," *Nanotechnology*, vol. 10, pp. 221-223 (1999).
Patolsky, F. et al., "Nanowire sensors for medicine and the life sciences," *Nanomedicine*, vol. 1, No. 1, pp. 51-65 (2006).
Soh, H. et al., "Integrated nanotube circuits: Controlled growth and ohmic contacting of single-walled carbon nanotubes," *Appl. Phys. Lett.*, vol. 75, No. 5, pp. 627-629 (1999).
Tang, Y.H. et al., "Si nanowires synthesized by laser ablation of mixed SiC and $SiO_2$ powders," *Chemical Physics Letters*, vol. 314, pp. 16-20 (1999).
Office Action mailed Aug. 7, 2006 in U.S. Appl. No. 11/082,372, filed Mar. 17, 2005.
Office Action mailed Mar. 18, 2008 in U.S. Appl. No. 11/543,337, filed Oct. 4, 2006.
International Search Report and Written Opinion from Int. Apl. No. PCT/US2007/008540, filed Jun. 4, 2007.
Office Action for U.S. Appl. No. 11/543,746, dated Feb. 3, 2010.
Office Action for U.S. Appl. No. 11/543,337, dated Mar. 23, 2010.
Chinese Office Action from application No. CN 200610139984.7, dated Mar. 24, 2010.
Office Action for U.S. Appl. No. 10/588,833 dated May 27, 2010.
Office Action for U.S. Appl. No. 11/543,746 dated Jun. 22, 2010.
Office Action for Japanese Patent Application No. 2005-549958 dated Apr. 5, 2010.

\* cited by examiner

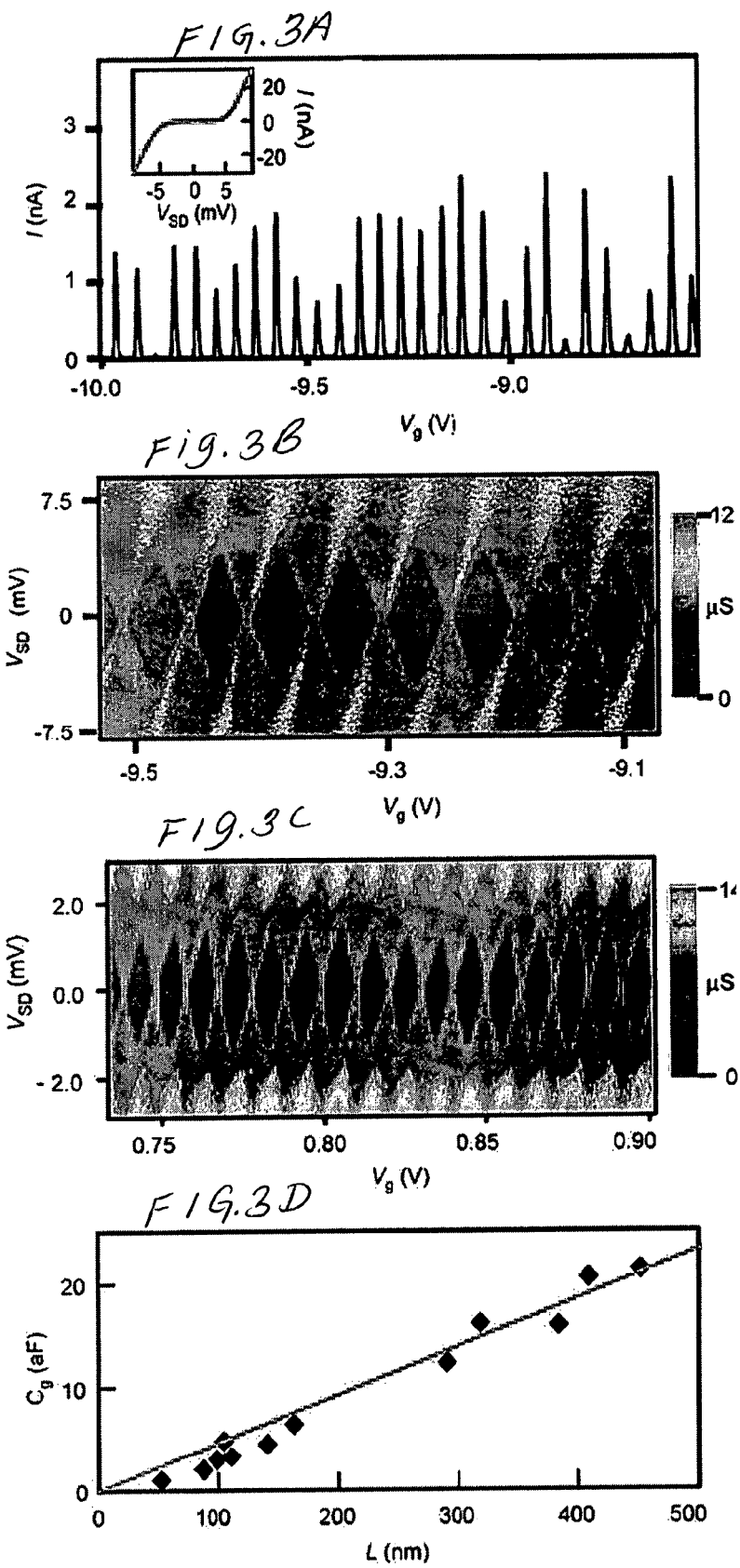

Quantum Well

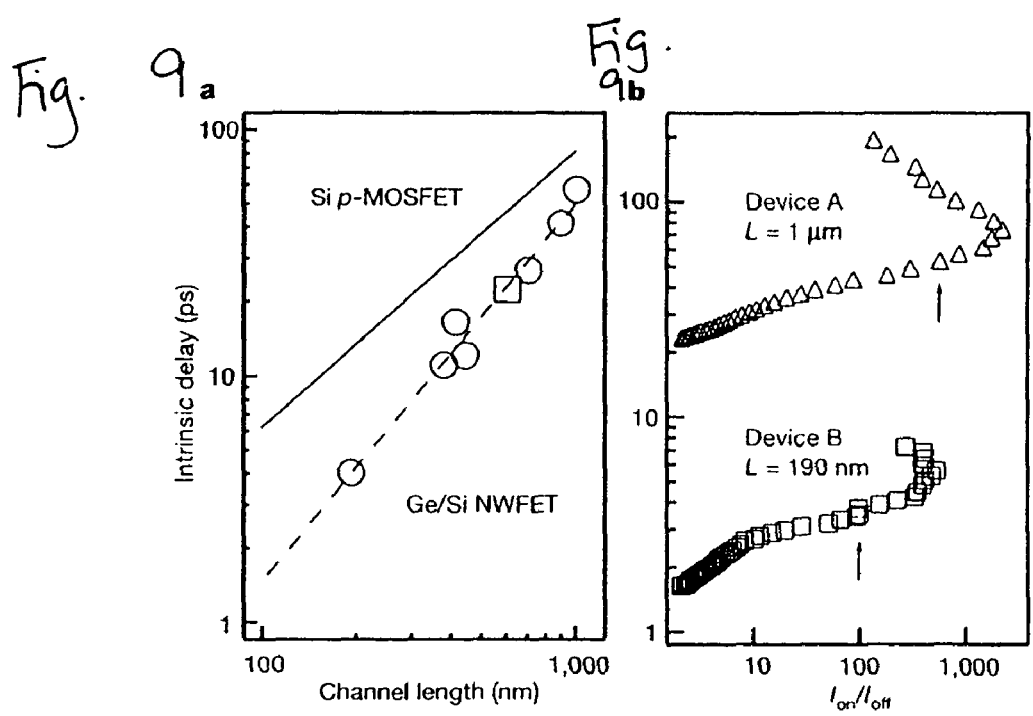

Fig. 10a
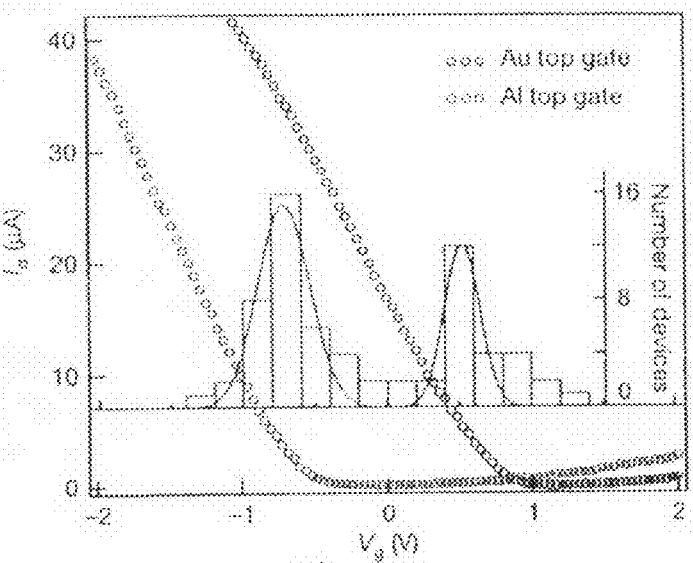
Fig. 10b
Fig. 10c
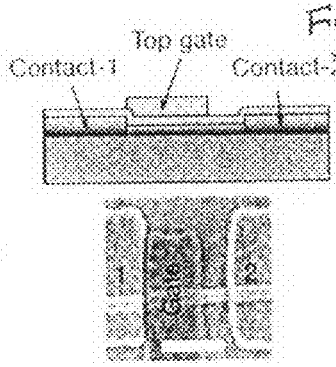
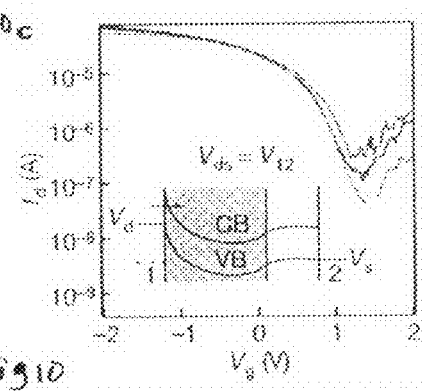
Fig. 10d
Fig. 10e
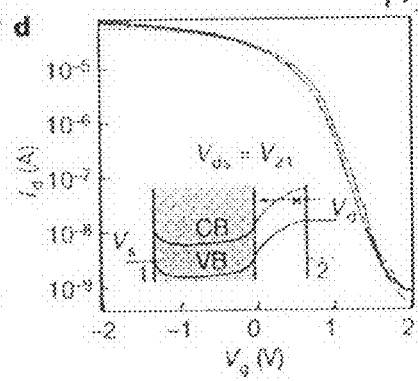
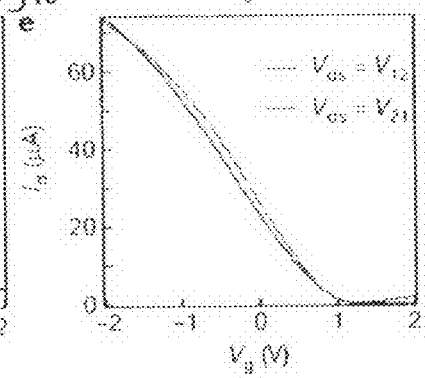

NANOWIRE HETEROSTRUCTURES

RELATED APPLICATIONS

This application is a continuation-in-part of International Patent Application No. PCT/US2005/034345, filed Sep. 21, 2005, entitled "Nanowire Heterostructures," by Lu, et al., published as WO 2006/132659 on Dec. 14, 2006, which application claims the benefit of U.S. Provisional Patent Application Ser. No. 60/687,807, filed Jun. 6, 2005, entitled "Nanowire Heterostructures," by Lu, et al. Each of these applications is incorporated herein by reference.

FEDERALLY SPONSORED RESEARCH

Research leading to various aspects of the present invention were sponsored, at least in part, by the Defense Advanced Research Projects Agency and the Army Research Office, Grant No. DAAD19-02-1-0039, and by the Office of Naval Research, Grant No. N00014-04-1-0591. The United States Government may have certain rights in the invention.

FIELD OF INVENTION

The present invention generally relates to nanoscale heterostructures and, in some cases, to nanowire heterostructures exhibiting ballistic transport, and/or to metal-semiconductor junctions that exhibit no or reduced Schottky barriers.

BACKGROUND

Interest in nanotechnology, in particular sub-microelectronic technologies such as semiconductor quantum dots and nanowires, has been motivated by the challenges of chemistry and physics at the nanoscale, and by the prospect of utilizing these structures in electronic and related devices.

A semiconductor nanowire, in an electronic device, is often fabricated in physical contact with one or more electrodes, which allow the nanowire to be interfaced with the rest of the device. Such electrodes are often metal, for example, gold or silver. However, the metal-semiconductor junction between the electrode and the nanowire creates a Schottky barrier, which inhibits conductance or transconductance measurements of the nanowire or otherwise impedes its performance. While Schottky barriers can be reduced by increasing dopant concentrations within the semiconductor nanowire, such increases in dopant concentrations will generally reduce the mobility of the charge carriers within the nanoscale wire, which can impede the performance of the nanowire. However, reducing dopant concentrations within the semiconductor nanowire will reduce the number of available charge carriers within the nanoscale wire, and it would be expected by those of ordinary skill in the art that such a reduction in dopant concentration would decrease the conductivity of the nanowire, ultimately rendering it an insulator if no charge carriers are present.

Accordingly, techniques are needed to improve properties of semiconductors, e.g. allowing the creation of metal-semiconductor junctions essentially free of Schottky barriers between the metal electrode and the semiconductor nanowire.

SUMMARY OF THE INVENTION

The present invention generally relates to nanoscale heterostructures and, in some cases, to nanowire heterostructures exhibiting ballistic transport, and/or to metal-semiconductor junctions that exhibit no or reduced Schottky barriers. The subject matter of the present invention involves, in some cases, interrelated products, alternative solutions to a particular problem, and/or a plurality of different uses of one or more systems and/or articles.

In one aspect, the invention provides an electronic device. In one set of embodiments, the electronic device includes a solid nanowire having a core and at least one shell surrounding at least a portion of the core, where the core is essentially undoped and consists essentially of germanium, and the shell is essentially undoped and consists essentially of silicon. In some cases, the electronic device also includes a metal electrode in physical contact with at least a portion of the shell, where the shell and the metal electrode do not form a Schottky barrier.

The electronic device, in another set of embodiments, includes a nanowire having a core and at least one shell surrounding at least a portion of the core, where the core is essentially undoped and consists essentially of a first elemental semiconductor, and the shell is essentially undoped and consists essentially of a second elemental semiconductor different from the first elemental semiconductor. The device may also include, in certain cases, a metal electrode in physical contact with at least a portion of the shell, where the shell and the metal electrode do not form a Schottky barrier, and/or form a Schottky barrier of less than about 0.5 eV.

In still another set of embodiments, the electronic device includes a nanowire having a core and at least one shell surrounding at least a portion of the core, where the core is essentially free of dopants (i.e., atomic dopants) able to produce charge carriers, and the shell is essentially free of dopants able to produce charge carriers. In some embodiments, the device also can include a metal electrode in physical contact with at least a portion of the shell, where the shell and the metal electrode do not form a Schottky barrier and/or form a Schottky barrier of less than 0.5 eV.

In yet another set of embodiments, the electronic device includes a nanoscale wire in physical contact with a metal. In some cases, the nanoscale wire and the metal do not form a Schottky barrier and/or form a Schottky barrier of less than 0.5 eV. According to still another set of embodiments, the electronic device includes a nanoscale wire in electrical communication with a non-nanoscale electrical contact. In some instances, between the nanoscale wire and the non-nanoscale contact, exists no Schottky barrier or a Schottky barrier of less than 0.5 eV.

Another set of embodiments of the invention provides an FET comprising a nanowire having a transconductance of at least about 30 microsiemens. Still another set of embodiments provides an FET comprising a nanowire having an on current of at least about 10 microamps. In one set of embodiments, the invention includes an FET comprising a nanowire having a scaled transconductance of at least about 1 mA/micron. In another set of embodiments, the invention includes an FET comprising a nanowire having a scaled on current of at least about 0.1 mA/micron.

In another aspect, the invention is a method. According to one set of embodiments, the method includes acts of injecting carriers into a solid nanowire having a core and at least one shell surrounding at least a portion of the core, where the core is essentially undoped and consists essentially of germanium, and the shell is essentially undoped and consists essentially of silicon. In some cases, the method also includes an act of ballistically transporting the carriers through at least a portion of the solid nanowire.

The method, according to another set of embodiments, includes acts of providing a nanoscale wire having a surface having a work function, selecting a metal having a work function essentially equal to the work function of the surface of the nanoscale wire, and contacting the metal and the nanoscale wire. In yet another set of embodiments, the method includes acts of providing a metal having a work function, preparing a nanoscale wire having a surface having a work function essentially equal to the work function of the metal, and contacting the metal and the nanoscale wire.

In another aspect, the present invention is directed to a method of making one or more of the embodiments described herein, for example, a nanowire heterostructure. In yet another aspect, the present invention is directed to a method of using one or more of the embodiments described herein, for example, a nanowire heterostructure. In still another aspect, the present invention is directed to a method of promoting one or more of the embodiments described herein, for example, a nanowire heterostructure.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 3A-3D illustrate various properties of certain unannealed Ge/Si nanowires of yet another embodiment of the invention;

FIGS. 9A-9B illustrate characteristics of certain FETs, in another embodiment of the invention;

FIGS. 10A-10E illustrate control of voltage and conduction, according to other embodiments of the invention.

DETAILED DESCRIPTION

Figure 1A:
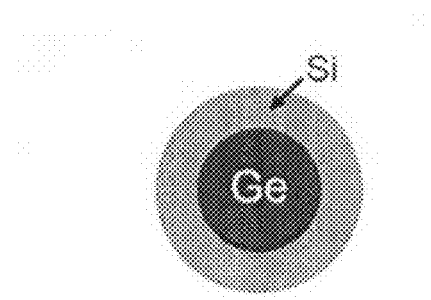
FIGS. 1A-1C illustrate certain Ge/Si nanowires in accordance with one embodiment of the invention.

The present invention generally relates to nanoscale heterostructures and/or heterostructures or junctions between nanoscale components and larger components. The semiconductor nanoscale components of the invention may exhibit unusual electronic properties due to quantum effects at the nanoscale. In some cases, the invention relates to nanowire heterostructures exhibiting ballistic transport, and/or to metal-semiconductor junctions that that exhibit no or reduced Schottky barriers. One aspect of the invention provides a solid nanowire having a core and a shell, both of which are essentially undoped. Surprisingly, it has been found that a solid nanowire can transport charge using a ballistic transport process in a manner significantly different from the identical (compositionally) material in larger, non-nanoscale form. It would have been expected by those of ordinary skill in the art that a nanoscale wire that is not doped has significantly reduced conductivity, e.g., acts as an insulator, as there would be no dopants within the nanoscale wire able to create charge carriers. As an alternative to chemical dopants, previous experiments of others, in which charge carriers were electronically injected into undoped semiconductor materials, have failed to show any charge transport. Although prior experiments have shown transport in doped core/shell nanowires, as discussed above, it was believed by those of ordinary skill in the art that the dopants within the nanowire created the charge carriers for transport, and thus the dopants within the nanowire were essential for transport.

In contrast, in certain aspects of the present invention, solid, undoped nanowires, for example, comprising a core and at least one shell, can nevertheless transport charge carriers therein. In one embodiment, the core may consist essentially of undoped germanium and the shell may consist essentially of undoped silicon, i.e., the undoped material is essentially free of other atoms or "dopants." Carriers are injected into the nanowire, which can be ballistically transported through the nanowire. In other embodiments, however, the invention is not limited to solid nanowires, and other configurations, involving other nanoscale wires, are also contemplated within the scope of the present invention. Yet another aspect of the invention provides a junction between a metal and a nanoscale wire that exhibit no or reduced Schottky barriers. As a non-limiting example, a nanoscale wire having a core and a shell may be in physical contact with a metal electrode, such that the Schottky barrier to the core is reduced or eliminated. Still other aspects of the invention are directed to electronic devices exhibiting such properties, and techniques for methods of making or using such devices.

Certain aspects of the present invention include a nanoscale wire (or nanoscopic wire) or other nanostructured material comprising one or more semiconductor and/or metal compounds. In some cases, the semiconductors and/or metals may be positioned to be in physical contact with each other (e.g., a "heterojunction"), and/or chemically and/or physically combined. In one set of embodiments, the nanoscale wire is positioned in physically contact with a larger, non-nanoscale metal. The nanoscopic wire may be, for example, a nanorod, a nanowire, a nanowhisker, or a nanotube. The nanoscopic wire may be used in a device, for example, as a semiconductor component, a pathway, etc. The selection of suitable metals and/or semiconductors will be apparent and readily reproducible by those of ordinary skill in the art with the benefit of the present disclosure.

Many nanoscale wires as used in accordance with the present invention are "isolated" or "free-standing" nanoscale wires. As used herein, "isolated nanoscale wire" means a nanoscale wire that is free of contact with another nanoscale wire. A "free-standing" nanoscale wire is a wire that is not attached to another article, and/or is made by a process in which, in at least one step, it is not in contact with or attached to another article, i.e., a free-standing nanoscale wire is defined by material that does not rely for its distinction, from other material, solely on the basis of its composition, but rather on its structure. A free-standing nanoscale wire is one that, in at least one step of its fabrication and use (e.g., prior to its being adhered, soldered, or the like to another material), can be readily removed from contact with surrounding materials without degrading its usefulness as a nanoscale wire (in contrast to the example, above, of the nanoscale doped section of a larger material). A free-standing nanoscale wire of the invention is also distinguished from nanotubes produced primarily by laser vaporization techniques that produce materials formed as ropes having diameters of about 2 nm to about 50 nm or more and containing many individual nanotubes. A free-standing nanoscale wire of the invention is also distinguished from conductive portions of articles which differ from surrounding material only by having been altered chemically or physically, in situ, i.e., where a portion of a uniform article is made different from its surroundings by selective doping, etching, etc. An "individual" or a "free-standing" article is one that can be (but need not be) removed from the location where it is made, as an individual article, and transported to a different location and combined with different components to make a functional device such as those described herein and those that would be contemplated by those of ordinary skill in the art upon reading this disclosure.

In some embodiments, the invention includes a nanoscale wire (or other nanostructured material) that is a single crystal. As used herein, a "single crystal" item (e.g., a semiconductor) is an item that has covalent bonding, ionic bonding, or a combination thereof throughout the item. Such a single-crystal item may include defects in the crystal, but is to be distinguished from an item that includes one or more crystals, not ionically or covalently bonded, but merely in close proximity to one another.

The nanoscale wire (or other nanostructured material) may comprise two or more regions having different compositions. Two or more regions having different compositions within the nanoscale wire that are in physical contact may define a "heterojunction." The heterojunction may be, for example, a semiconductor/semiconductor junction, a semiconductor/metal junction, a semiconductor/insulator junction, a metal/metal junction, a metal/insulator junction, an insulator/insulator junction, or the like. The heterojunction may also be, for example, a heterojunction of two materials, an undoped semiconductor to an undoped or a doped semiconductor, or a junction between regions having different dopant concentrations. The heterojunction may also be, for instance, a p/n junction, a p/p junction, an n/n junction, a p/i junction (where i refers to an intrinsic semiconductor), an n/i junction, an i/i junction, or the like. The heterojunction may also be a defected region to a perfect single crystal, an amorphous region to a crystal, a crystal to another crystal, an amorphous region to another amorphous region, a defected region to another defected region, an amorphous region to a defected region, or the like. As an example, a p/n junction may be defined by at least one n-type semiconductor and at least one p-type semiconductor positioned adjacent to each other within the nanoscale wire, where at least one portion of each region contacts at least one portion of the other region, and each semiconductor including portions that do not contact the other component.

In some embodiments, the heterojunction between two differing regions (e.g., between a core and shell, between different longitudinal regions of a core or shell, between two different shells, etc.) may be "atomically-abrupt," where there is a sharp transition at the atomic scale between two adjacent regions that differ in composition. However, in other embodiments, the junction between two differing regions may be more gradual. For example, the "overlap region" between the adjacent regions may be a few nanometers wide, for example, less than about 10 nm, less than about 20 nm, less than about 40 nm, less than about 50 nm, less than about 100 nm, or less than about 500 nm. In certain embodiments, the overlap region between a first region having a composition and a second region having a composition different from the first region (i.e., different concentrations or different species) can be defined as the distance between where the composition of the overlap region ranges between about 10 vol % and about 90 vol % of the composition of the first region, with the remainder having a complementary amount of the composition of the second region. In certain embodiments of the invention, nanoscale wires having more than one junction between two regions having different compositions are also contemplated. For example, a nanoscale wire may have 2, 3, 4, or more overlap regions. The number of periods and the repeat spacing may be constant or varied during growth.

More than two regions may be present within the nanoscale wire, and these regions may have unique compositions or may comprise the same compositions. As one example, a wire may have a first region having a first composition, a second region having a second composition, and a third region having a third composition or the same composition as the first composition. Each region of the nanoscale wire may have any shape or dimension, and these can be the same or different between regions. For example, a region may have a smallest dimension of less than 1 micron, less than 100 nm, less than 10 nm, or less than 1 nm. In some cases, one or more regions may be a single monolayer of atoms (i.e., "delta-doping"). In certain cases, the region may be less than a single monolayer thick (for example, if some of the atoms within the monolayer are absent).

In some embodiments, a gradual change in composition between two adjacent regions may relieve strain and may enable the defect free junctions and superlattices. However, in other embodiments, atomically-abrupt interfaces may be desirable, for example, in certain photonic and electronic applications. The nature of the interface between the two adjacent regions may be controlled by any suitable method, for example, by using different nanocluster catalysts or varying the growth temperature when reactants are switched during synthesis. Nanoscale wires having atomically abrupt regions may be fabricated, for example, by reducing the diameter of the nanoscale wire, for example, by reducing the size of the starting nanocluster, or by controlling exposure of the growing wire to dopant gases, for example, by selectively purging or evacuating the region surrounding the wire between different gas exposures or reaction conditions. All of these embodiments can be provided with one, or multiple shells. These shells can be of the same or different composition relative to each other, and any of the shells can be of the same composition of a segment of the core, or of a different composition, or can contain the same or different concentration of a dopant as is provided in a section of the core. The shells may be grown using any suitable growth technique, for example, including the techniques described herein, such as CVD or LCG.

The two or more regions may be radially arranged (e.g., as in a core/shell arrangement), and/or longitudinally arranged relative to each other within the nanoscale wire. As a specific example, the regions may be arranged in a layered structure within the nanoscale wire, and one or more of the regions may be delta-doped or at least partially delta-doped. As another example, the nanoscale wire may have multiple regions of semiconductor materials arranged longitudinally. In another example, a nanoscale wire may have two regions having different compositions arranged longitudinally, surrounded by a third region or several regions, each having a composition different from that of the other regions. As another example, the nanoscale wire may have a series of regions positioned both longitudinally and radially relative to each other. The arrangement can include a core that differs in composition along its length (changes in composition or concentration longitudinally), while the lateral (radial) dimensions of the core do, or do not, change over the portion of the length differing in composition. The shell portions can be adjacent each other (contacting each other, or defining a change in composition or concentration of a unitary shell structure longitudinally), or can be separated from each other by, for example, air, an insulator, a fluid, or an auxiliary, non-nanoscale wire component. The shell portions can be positioned directly on the core, or can be separated from the core by one or more intermediate shells portions that can themselves be constant in composition longitudinally, or varying in composition longitudinally, i.e., the invention allows the provision of any combination of a nanowire core and any number of radially-positioned shells (e.g., concentric shells), where the core and/or any shells can vary in composition and/or concentration longitudinally, any shell sections can be spaced from any other shell sections longitudinally, and different numbers of shells can be provided at different locations longitudinally along the structure.

The regions of the nanoscale wire may be distinct from each other with minimal cross-contamination, or the composition of the nanoscale wire may vary gradually from one region to the next. The regions may be both longitudinally arranged relative to each other, or radially arranged (e.g., as in a core/shell arrangement) on the nanoscale wire. As one example, the nanoscale wire may have multiple regions of alternating semiconductor materials arranged longitudinally, each having a segment length of about 500 nm. In another example, a nanoscale wire may have two regions having different compositions arranged longitudinally, surrounded by a third region or more having a composition different from that of the other regions. As a specific example, the regions may be arranged in a layered structure within the nanoscale wire, and one or more of the regions may be delta-doped or partially delta-doped. One example of a nanoscale wire includes at least one core portion, that is constant in composition along its length, and includes at least two shell portions, arranged longitudinally relative to each other, each of which is radially arranged relative to the core, each differing from the other in composition. The arrangement can include a core that differs in composition along its length (changes in composition or concentration longitudinally). The shell portions can be adjacent each other (contacting each other, or defining a change in composition or concentration of a unitary shell structure longitudinally), or can be separated from each other by, for example, air, an insulator, a fluid, or an auxiliary, non-nanowire component. The shell portions can be positioned directly on the core, or can be separated from the core by one or more intermediate shells portions that can themselves be consistent in composition longitudinally, or varying in composition longitudinally. That is, the invention allows the provision of any combination of a nanowire core and any number of radially-positioned shells (e.g., concentric shells), where the core and/or any shells can vary in composition and/or concentration longitudinally, any shell sections can be spaced from any other shell sections longitudinally, and different numbers of shells can be provided at different locations longitudinally along the structure.

In some embodiments, each region of the nanoscale wire may be doped or essentially undoped, i.e., the region of the nanoscale wire does not contain dopant at a concentration that is sufficient to produce a significant fraction of the charge carriers within the nanoscale wire. For example, a dopant may be present in an essentially undoped such that about 80%, about 90%, about 95%, or nearly 100% of the charge carriers within the nanoscale wire do not arise from dopant. In some cases, there are no dopants present in a region of a nanoscale wire at a detectable level. In some embodiments, an essentially undoped region of the nanoscale wire may be an elemental semiconductor, i.e., an element that is semiconductive, for example, silicon, germanium, tin, selenium, tellurium, boron, diamond (carbon), phosphorous, etc. Thus, as specific, non-limiting examples, a nanowire may comprise a core comprising or consisting essentially of germanium (or silicon), and a shell comprising or consisting essentially of silicon (or germanium); a core comprising or consisting essentially of germanium, a first shell surrounding at least a portion of the core comprising or consisting essentially of silicon, and a second shell surrounding at least a portion of the first shell comprising or consisting essentially of germanium, etc.

If a dopant is present, the dopant may be, for example, a solid solution of various elemental semiconductors. Examples include a mixture of boron and carbon, a mixture of boron and P($BP_6$), a mixture of boron and silicon, a mixture of silicon and carbon, a mixture of silicon and germanium, a mixture of silicon and tin, a mixture of germanium and tin, etc. In some embodiments, the dopant may include mixtures of Group IV elements, for example, a mixture of silicon and carbon, or a mixture of silicon and germanium. In other embodiments, the dopant may include mixtures of Group III and Group V elements, for example, BN, BP, BAs, AlN, AlP, AlAs, AlSb, GaN, GaP, GaAs, GaSb, InN, InP, InAs, or InSb. Mixtures of these combinations may also be used, for example, a mixture of BN/BP/BAs, or BN/AlP. In other embodiments, the dopants may include mixtures of Group III and Group V elements. For example, the mixtures may include AlGaN, GaPAs, InPAs, GaInN, AlGaInN, GaInAsP, or the like. In other embodiments, the dopants may also include mixtures of Group II and Group VI elements. For example, the dopant may include mixtures of ZnO, ZnS, ZnSe, ZnTe, CdS, CdSe, CdTe, HgS, HgSe, HgTe, BeS, BeSe, BeTe, MgS, MgSe, or the like. Alloys or mixtures of these dopants are also be possible, for example, ZnCdSe, or ZnSSe or the like. Additionally, mixtures of different groups of semiconductors may also be possible, for example, combinations of Group II-Group VI and Group III-Group V elements, such as $(GaAs)_x(ZnS)_{1-x}$. Other non-limiting examples of dopants may include mixtures of Group IV and Group VI elements, for example GeS, GeSe, GeTe, SnS, SnSe, SnTe, PbO, PbS, PbSe, PbTe, etc. Other dopant mixtures may include mixtures of Group I elements and Group VII elements, such as CuF, CuCl, CuBr, CuI, AgF, AgCl, AgBr, AgI, or the like. Other dopant mixtures may include different mixtures of these elements, such as $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, $(Al, Ga, In)_2(S, Se, Te)_3$, $Al_2CO$, $(Cu, Ag)(Al, Ga, In, Tl, Fe)(S, Se, Te)_2$, $HfO_2$, $ZrO_2$, or the like.

In some embodiments, the nanoscale wires of the invention may exhibit ballistic transport, i.e., the transport of carriers, such as electrons, through a nanoscale wire such that there is low or negligible scattering. Thus, in ballistic transport, the mean free path of the carriers (i.e., the average distance a carrier such as an electron can travel in a straight line before being scattered, e.g., by an impurity atom or the collective motion of atoms) through the nanoscale wire is significantly greater than the distance between scattering centers within the nanoscale wire, and in some cases, is comparable to the length of the nanoscale wire, e.g., the mean free path of the carriers within the nanoscale wire may be on the order of at least tens of nanometers. Ballistic transport may be enhanced, in some cases, through the use of nanoscale wires (or portions thereof) that are essentially undoped. Without wishing to be bound to any theory, it is believed that, in a nanoscale wire (or portion thereof) that is essentially undoped, the relative lack of dopants, which contribute to the scattering of carriers, allows increased ballistic transport of carriers within the nanoscale wire to occur. In some cases, the mean free path of the carriers within the nanoscale wire may be at least about 5 nm, at least about 10 nm, at least about 30 nm, at least about 100 nm, at least about 200 nm, at least about 300 nm, at least about 400 nm, or at least about 500 nm or more. Such ballistic transport may be observed at low temperatures (e.g., less than about 5 K, less than about 10 K, less than about 50 K, less than about 100 K, etc.), and in some cases, at higher temperatures, including room temperature (about 25° C.), for instance, by reducing scattering from the collective motion of atoms.

As mentioned, in some embodiments, carriers may be "injected" into a nanoscale wire of the invention, such as a nanoscale wire that includes an essentially undoped portion. Any electrical injection source may be used. For example, electrical injection may be accomplished through a crossed wire configuration (i.e., where another nanoscale wire contacts the nanoscale wire), an electrode or distributed electrode configuration that contacts the nanoscale wire, and/or a core/shell configuration or other heterostructure configuration (for example, from a shell region to the core region or vice versa, or from a second longitudinally positioned region, etc.). The carriers to be injected into the device include (n-type) electrons or (p-type) "holes," depending on the particular application.

In one set of embodiments, the carriers are injected into the nanoscale wire using an electrode, such as a metal electrode. Examples of potentially suitable metals for the metal electrode include, but are not limited to, nickel, gold, silver, copper, zinc, cadmium, iron, nickel, cobalt, aluminum, chromium, platinum, tungsten, or the like, as well as combinations thereof. In some cases, the nanowire heterostructure is designed such that a reduced, or essentially no Schottky barrier is created between the metal electrode and the nanoscale wire. A Schottky barrier, as is known to those of ordinary skill in the art, is a metal-semiconductor junction where there is a mismatch in the energy position of the majority carrier band edge of the semiconductor and the metal Fermi level, for example, between the conduction band minimum and the Fermi level for an n-type semiconductor, or the valence band maximum of the semiconductor and the metal Fermi level for a p-type semiconductor. Such a barrier may limit the performance of the nanoscale device, or may prevent accurate conductance or transconductance measurements of the nanoscale wire to be taken using metal electrodes.

In some embodiments of the present invention, by choosing a semiconductor and selecting an appropriate metal (and/or by choosing a metal and selecting an appropriate semiconductor), the Schottky barrier between the semiconductor and the metal may be reduced or be essentially eliminated. As a particular non-limiting example, in a core/shell nanowire, a semiconductor and a metal electrode may be chosen such that the Schottky barrier between the nanowire and the semiconductor core may be reduced or be essentially eliminated. Those of ordinary skill in the art will know of techniques for measuring the height of the Schottky barrier and/or the difference in work function or energy level in a metal-semiconductor junction, e.g., by measuring current-voltage characteristics of the metal-nanoscale wire junction, and/or by temperature dependence of current through the metal-nanoscale wire junction, and/or by referencing published values of work functions for various materials. An example of such a technique is discussed in the Example, below.

As another example, in the case of a Ge/Si core/shell nanowire with nickel contacts at proper annealing conditions, the Schottky barrier to the Ge core may be reduced and/or eliminated (or equivalently, the device exhibits a negative Schottky potential), i.e., the contacts may be said to be "transparent." If the carriers can be transported ballistically through the nanowire, the conductance of the nanowire may exhibit quantized or discrete levels (e.g., as a function of $e^2/h$).

In some cases, the Schottky barrier may be reduced at least to a level such that the conductance or transconductance of the nanoscale wire can be determined to exist in quantized or discrete levels (e.g., as a function of $e^2/h$) using the metal electrodes. For example, the Schottky barrier may be not essentially eliminated, but the barrier may be reduced such that the Schottky barrier between the semiconductor and the metal is less than about 1 eV, less than about 0.9 eV, less than about 0.8 eV, less than about 0.7 eV, less than about 0.65 eV, less than about 0.6 eV, less than about 0.55 eV, less than about 0.5 eV, less than about 0.45 eV, less than about 0.4 eV, less than about 0.35 eV, less than about 0.3 eV, less than about 0.25 eV, less than about 0.2 eV, less than about 0.15 eV, less than about 0.1 eV, or less than about 0.05 eV.

It should be noted that the present invention is not limited to metal-semiconductor junctions between a core/shell nanowire and a metal electrode. Any nanoscale wire, or other nanoscale structure, having a semiconductor portion in physical contact with a metal electrode, in which no Schottky barrier is created between the metal and the semiconductor, is also contemplated within the present invention. In addition, the present invention includes embodiments in which no Schottky barrier is present between the nanoscale wire and a non-nanoscale electrical contact. For example, an electrode or other device may be in electrical communication with both the nanoscale wire and the non-nanoscale electrical contact, where the junctions between such components are not Schottky barriers.

Such junctions that are essentially free of Schottky barriers allows the fabrication of certain high performance devices. For example, a FET or other electronic device may be fabricated using a core/shell nanowire of the invention, such as a Ge/Si core/shell nanowire. Significantly higher transconductances i.e., the change in the drain/source current, divided by the change in the gate/drain voltage when a constant drain/source voltage is applied) may be measured in such a nanowire device, for example, transconductances of at least about 10 microsiemens, at least about 20 microsiemens, at least about 30 microsiemens, at least about 40 microsiemens, at least about 50 microsiemens, at least about 60 microsiemens, at least about 75 microsiemens, at least about 100 microsiemens, or more in some cases. In other cases, the FET or other electronic device may display a significant "on" current, e.g., an "on" current of at least about 10 microamps, at least about 20 microamps, at least about 30 microamps, at least about 40 microamps, at least about 50 microamps, at least about 60 microamps, at least about 75 microamps, at least about 100 microamps, or more in some cases.

In still other cases, the FET or other electronic device may display significantly higher "scaled" transconductances or "on" currents, relative to other, planar devices. For example, on a scaled basis (i.e., per unit length), the transconductance of the FET or other electronic device may be at least about 100 microsiemens/micron, at least about 300 microsiemens/micron, at least about 1 mS/micron, at least about 2 mS/micron, at least about 3 mS/micron, at least about 4 mS/micron, or at least about 5 mS/micron or more in some instances. As another example, on a scaled basis, the "on" current may be at least about 100 microamps/micron, at least about 300 microamps/micron, at least about 400 microamps/micron, at least about 500 microamps/micron, at least about 600 microamps/micron, at least about 700 microamps/micron, at least about 800 microamps/micron, at least about 900 microamps/micron, at least about 1 mA/micron, at least about 2 mA/micron, at least about 3 mA/micron, at least about 4 mA/micron, at least about 5 mA/micron, at least about 6 mA/micron, at least about 7 mA/micron, at least about 10 mA/micron, or more in some instances.

Other embodiments of the present invention include the ability to fabricate essentially any electronic device using components such as those described above, such as heterojunction nanowires or metal-semiconductor junctions that is not or exhibits a reduced Schottky barrier. Examples of such devices include, but are not limited to, field effect transistors (FETs), bipolar junction transistors (BJTs), tunnel diodes, modulation doped superlattices, complementary inverters, light emitting devices, light sensing devices, biological system imagers, biological and chemical detectors or sensors, thermal or temperature detectors, Josephine junctions, nanoscale light sources, photodetectors such as polarization-sensitive photodetectors, gates, inverters, AND, NAND, NOT, OR, TOR, and NOR gates, latches, flip-flops, registers, switches, clock circuitry, static or dynamic memory devices and arrays, state machines, gate arrays, and any other dynamic or sequential logic or other digital devices including programmable circuits. Also included are analog devices and circuitry, including but not limited to, amplifiers, switches and other analog circuitry using active transistor devices, as well as mixed signal devices and signal processing circuitry. Also included are devices with low turn-on voltages; devices with high turn-on voltages; and computational devices such as a half-adder. Furthermore, junctions having large dielectric contrasts between the two regions may be used to produce 1D waveguides with built-in photonic band gaps, or cavities for nanoscale wire lasers. In some embodiments, the nanoscale wires of the present invention may be manufactured during the device fabrication process. In other embodiments, the nanoscale wires of the present inventions may first be synthesized, then assembled in a device. In one set of embodiments, the invention includes a nanoscale inverter. Any nanoscale inverter may be contemplated that is constructed using adjacent regions having different compositions. In another set of embodiments, the invention includes a nanoscale diode. Any nanoscale diode may be contemplated that is constructed using adjacent regions having different compositions, for example, Zener diodes, tunnel diodes, light-emitting diodes, and the like.

In various aspects, the present invention includes a method of preparing a nanostructure. Certain arrangements may utilize metal-catalyzed CVD techniques ("chemical vapor deposition") to synthesize individual nanoscale wires. CVD synthetic procedures useful for preparing individual wires directly on surfaces and in bulk form are generally known, and can readily be carried out by those of ordinary skill in the art. Nanoscale wires may also be grown through laser catalytic growth. With the same basic principles as LCG, if uniform diameter nanoclusters (less than 10% to 20% variation depending on how uniform the nanoclusters are) are used as the catalytic cluster, nanoscale wires with uniform size (diameter) distribution can be produced, where the diameter of the wires is determined by the size of the catalytic clusters. By controlling growth time, nanoscale wires with different lengths can be grown.

One technique that may be used to grow nanoscale wires is catalytic chemical vapor deposition ("C-CVD"). In C-CVD, reactant molecules are formed from the vapor phase. If doping is desired, the nanoscale wires may be doped by introducing the doping element into the vapor phase reactant (e.g. diborane and phosphane). The doping concentration may be controlled by controlling the relative amount of the doping compound introduced in the composite target. The final doping concentration or ratios are not necessarily the same as the vapor-phase concentration or ratios. By controlling growth conditions, such as temperature, pressure or the like, nanoscale wires having the same doping concentration may be produced.

To produce a nanoscale wire having adjacent regions having different compositions within a nanoscale wire, the ratio of gas reactant may be varied (e.g. from about 1 ppm to about 10%, from about 10 ppm to about 20%, from about 100 ppm to about 50%, or the like), and/or the types of gas reactants used may be altered during growth of the nanoscale wire. The gas reactant ratio or the type of gas reactants used may be altered several times during growth of the nanoscale wire, which may produce nanoscale wires comprising regions having multiple compositions, all of which may or may not be unique.

Another technique for direct fabrication of nanoscale wire junctions during synthesis is referred to as laser catalytic growth ("LCG"). In LCG, reactants and/or dopants are controllably introduced during vapor phase growth of nanoscale wires. Laser vaporization of a composite target composed of a desired material (e.g. silicon, germanium, indium phosphide, etc.) and a catalytic material (e.g. a nanoparticle catalyst) may create a hot, dense vapor. The vapor may condense into liquid nanoclusters through collision with a buffer gas. Growth may begin when the liquid nanoclusters become supersaturated with the desired phase and can continue as long as reactant is available. Growth may terminate when the nanoscale wire passes out of the hot reaction zone and/or when the temperature is decreased. The nanoscale wire may be further subjected to different semiconductor reagents during growth.

In LCG, vapor phase semiconductor reactants required for nanoscale wire growth may be produced by laser ablation of solid targets, vapor-phase molecular species, or the like. To create a junction within a nanoscale wire, the addition of the first reactant may be stopped during growth, and then a second reactant may be introduced for the remainder of the synthesis. Repeated modulation of the reactants during growth is also contemplated, which may produce nanoscale wire superlattices. LCG also may require a nanocluster catalyst suitable for growth of the different superlattice components, for example, a gold nanocluster catalyst can be used in a wide-range of III-V and IV materials, for example, silicon, germanium, etc. Nearly monodisperse metal nanoclusters may be used to control the diameter, and through growth time, the length various semiconductor nanoscale wires.

The catalytic clusters or the vapor phase reactants may be produced by any suitable technique. For example, laser ablation techniques may be used to generate catalytic clusters or vapor phase reactant that may be used during LCG. Other techniques may also be contemplated, such as thermal evaporation techniques. The laser ablation technique may generate liquid nanoclusters that may subsequently define the size and direct the growth direction of the nanoscopic wires. The diameters of the resulting nanoscale wires may be determined by the size of the catalyst cluster, which in turn may be determined using routine experiments that vary the growth conditions, such as background pressure, temperature, flow rate of reactants, and the like. For example, lower pressure generally produces nanoscale wires with smaller diameters. Further diameter control may be achieved by using uniform diameter catalytic clusters.

As a particular example, LCG methods may be used to create nanoscale wires having one or more shells. For example, by altering the synthetic conditions during laser catalytic growth, homogeneous reactant decomposition may occur on the surface of the nanoscale wire. Control of the synthetic conditions may lead to a shell forming on the surface of the nanoscale wire, and in some embodiments, the synthetic reaction conditions may be controlled to cause the formation of a thin, uniform shell, a shell having a thickness of one atomic layer, or less in some cases. In other embodiments, by modulating or altering the reactants within the laser catalytic growth system, more than one shell may be built up on the outer surface of the nanoscale wire. As one example, a germanium nanoscale wire core may be grown, and additional semiconductor materials may be deposited onto the surface, for example, a silicon shell. The boundaries between the shells may be atomically abrupt, or may be graduated in some fashion, depending on how reactants such as, for example, silane, germane, or diborane are introduced into the laser catalytic growth system. Arbitrary sequences of Si, Ge, and alloy overlayers on both Si and Ge nanowire cores may also be prepared. Other factors may also contribute to the growing nanoscale wire, such as, for example, the reaction temperature, or the sample position within the furnace. By varying these parameters, the ratio of axial growth to radio growth may be controlled as desired.

Any catalyst able to catalyze the production of nanoscale wires may be used. Gold may be useful in certain embodiments. A wide range of other materials may also be contemplated, for example, a transition metal such as silver, copper, zinc, cadmium, iron, nickel, cobalt, and the like. Generally, any metal able to form an alloy with the desired semiconductor material, but does not form a more stable compound than with the elements of the desired semiconductor material may be used as the catalyst. The buffer gas may be any inert gas, for example, $N_2$ or a noble gas such as argon. In some embodiments, a mixture of $H_2$ and a buffer gas may be used to reduce undesired oxidation by residual oxygen gas. A reactive gas used during the synthesis of the nanoscale wire may also be introduced when desired, for example, ammonia for semiconductors containing nitrogen, such as gallium nitride. Nanoscale wires may also be flexibly doped by introducing one or more dopants into the composite target, for example, a germanium alloy during n-type doping of InP. The doping concentration may be controlled by controlling the relative amount of doping element, for example, between 0 and about 10% or about 20%, introduced in the composite target.

Laser ablation may generate liquid nanoclusters that subsequently define the size and direct the growth direction of the nanoscale wires. The diameters of the resulting nanoscale wires are determined by the size of the catalyst cluster, which may be varied by controlling the growth conditions, such as the pressure, the temperature, the flow rate and the like. For example, lower pressure may produce nanoscale wires with smaller diameters in certain cases. Further diameter control may be performed by using uniform diameter catalytic clusters.

With same basic principle as LCG, if uniform diameter nanoclusters (less than 10-20% variation depending on how uniform the nanoclusters are) are used as the catalytic cluster, nanoscale wires with uniform size (diameter) distribution can be produced, where the diameter of the nanoscale wires is determined by the size of the catalytic clusters. By controlling the growth time or the position of the sample within the reactor, nanoscale wires with different lengths or different shell thicknesses may be grown.

Nanoscale wires having uniform diameters or size distributions may be produced in embodiments where the diameter of the nanoscale wire is determined by the size of the catalytic cluster. For example, uniform diameter nanoclusters (for example, having a variation of less than about 10% to about 20% in the average diameter) may be used as the starting catalytic clusters. By controlling the growth time, nanoscale wires having different lengths may be grown.

Other techniques to produce nanoscale semiconductors such as nanoscale wires are also contemplated. For example, nanoscale wires of any of a variety of materials may be grown directly from vapor phase through a vapor-solid process. Also, nanoscale wires may also be produced by deposition on the edge of surface steps, or other types of patterned surfaces. Further, nanoscale wires may be grown by vapor deposition in or on any generally elongated template. The porous membrane may be porous silicon, anodic alumina, a diblock copolymer, or any other similar structure. The natural fiber may be DNA molecules, protein molecules carbon nanotubes, any other elongated structures. For all the above described techniques, the source materials may be a solution or a vapor. In some cases, while in solution phase, the template may also include be column micelles formed by surfactant.

In some cases, the nanoscale wire may be doped after formation. In one technique, a nanoscale wire having a substantially homogeneous composition is first synthesized, then is doped post-synthetically with various dopants. Such doping may occur throughout the entire nanoscale wire, or in one or more portions of the nanoscale wire, for example, in a wire having multiple regions differing in composition.

One aspect of the invention provides for the assembly, or controlled placement, of nanoscale wires on a surface. Any substrate may be used for nanoscale wire placement, for example, a substrate comprising a semiconductor, a substrate comprising a metal, a substrate comprising a glass, a substrate comprising a polymer, a substrate comprising a gel, a substrate that is a thin film, a substantially transparent substrate, a non-planar substrate, a flexible substrate, a curved substrate, etc. In some cases, assembly can be carried out by aligning nanoscale wires using an electrical field. In other cases, assembly can be performed using an arrangement involving positioning a fluid flow directing apparatus to direct fluid containing suspended nanoscale wires toward and in the direction of alignment with locations at which nanoscale wires are desirably positioned.

In certain cases, a nanoscale wire (or other nanostructure) is formed on the surface of a substrate, and/or is defined by a feature on a substrate. In one example, a nanostructure, such as a nanoscale wire, is formed as follows. A substrate is imprinted using a stamp or other applicator to define a pattern, such as a nanoscale wire or other nanoscale structure. After removal of the stamp or other applicator, at least a portion of the imprintable layer is removed, for example, through etching processes such as reactive ion etching (RIE), or other known techniques. In some cases, enough imprintable material may be removed from the substrate so as to expose portions of the substrate free of the imprintable material. A metal or other materials may then be deposited onto at least a portion of the substrate, for example, gold, copper, silver, chromium, etc. In some cases, a "lift-off" step may then be performed, where at least a portion of the imprintable material is removed from the substrate. Metal or other material deposited onto the imprintable material may be removed along with the removal of the imprintable material, for example, to form one or more nanoscale wires. Structures deposited on the surface may be connected to one or more electrodes in some cases. The substrate may be any suitable substrate that can support an imprintable layer, for example, comprising a semiconductor, a metal, a glass, a polymer, a gel, etc. In some cases, the substrate may be a thin film, substantially transparent, non-planar, flexible, and/or curved, etc.

In certain cases, an array of nanoscale wires may be produced by providing a surface having a plurality of substantially aligned nanoscale wires, and removing, from the surface, a portion of one or more of the plurality of nanoscale wires. The remaining nanoscale wires on the surface may then be connected to one or more electrodes. In certain cases, the nanoscopic wires are arranged such that they are in contact with each other; in other instances, however, the aligned nanoscopic wires may be at a pitch such that they are substantially not in physical contact.

In certain cases, nanoscale wires are positioned proximate a surface using flow techniques, i.e., techniques where one or more nanoscale wires may be carried by a fluid to a substrate. Nanoscale wires (or any other elongated structures) can be aligned by inducing a flow of a nanoscale wire solution on surface, where the flow can include channel flow or flow by any other suitable technique. Nanoscale wire arrays with controlled position and periodicity can be produced by patterning a surface of a substrate and/or conditioning the surface of the nanoscale wires with different functionalities, where the position and periodicity control may be achieved by designing specific complementary forces between the patterned surface and the nanoscale wires. Nanoscale wires can also be assembled using a Langmuir-Blodgett (LB) trough. Nanoscale wires may first be surface-conditioned and dispersed to the surface of a liquid phase to form a Langmuir-Blodgett film. In some cases, the liquid may include a surfactant, which can, in some cases, reduce aggregation of the nanoscale wires and/or reduce the ability of the nanoscale wires to interact with each other. The nanoscale wires can be aligned into different patterns (such as parallel arrays or fibers) by compressing the surface or reducing the surface area of the surface.

Another arrangement involves forming surfaces on a substrate including regions that selectively attract nanoscale wires surrounded by regions that do not selectively attract them. Surfaces can be patterned using known techniques such as electron-beam patterning, "soft-lithography" such as that described in International Patent Application Serial No. PCT/US96/03073, entitled "Microcontact Printing on Surfaces and Derivative Articles," filed Mar. 1, 1996, published as Publication No. WO 96/29629 on Jul. 26, 1996; or U.S. Pat. No. 5,512,131, entitled "Formation of Microstamped Patterns on Surfaces and Derivative Articles," issued Apr. 30, 1996, each of which is incorporated herein by reference. Additional techniques are described in U.S. Patent Application Ser. No. 60/142,216, entitled "Molecular Wire-Based Devices and Methods of Their Manufacture," filed Jul. 2, 1999, incorporated herein by reference. Fluid flow channels can be created at a size scale advantageous for placement of nanoscale wires on surfaces using a variety of techniques such as those described in International Patent Application Serial No. PCT/US97/04005, entitled "Method of Forming Articles and Patterning Surfaces via Capillary Micromolding," filed Mar. 14, 1997, published as Publication No. WO 97/33737 on Sep. 18, 1997, and incorporated herein by reference. Other techniques include those described in U.S. Pat. No. 6,645,432, entitled "Microfluidic Systems Including Three-dimensionally Arrayed Channel Networks," issued Nov. 11, 2003, incorporated herein by reference.

Chemically patterned surfaces other than SAM-derivatized surfaces can be used, and many techniques for chemically patterning surfaces are known. Another example of a chemically patterned surface may be a micro-phase separated block copolymer structure. These structures may provide a stack of dense lamellar phases, where a cut through these phases reveals a series of "lanes" wherein each lane represents a single layer. The assembly of nanoscale wires onto substrate and electrodes can also be assisted using bimolecular recognition in some cases. For example, one biological binding partner may be immobilized onto the nanoscale wire surface and the other one onto a substrate or an electrode using physical adsorption or covalently linking. An example technique which may be used to direct the assembly of a nanoscopic wires on a substrate is by using "SAMs," or self-assembled monolayers. Any of a variety of substrates and SAM-forming material can be used along with microcontact printing techniques, such as those described in International Patent Application Serial No. PCT/US96/03073, entitled "Microcontact Printing on Surfaces and Derivative Articles," filed Mar. 1, 1996, published as Publication No. WO 96/29629 on Jul. 26, 1996, incorporated herein by reference in its entirety.

In some cases, the nanoscale wire arrays may also be transferred to another substrate, e.g., by using stamping techniques. In certain instances, nanoscale wires may be assembled using complementary interaction, i.e., where one or more complementary chemical, biological, electrostatic, magnetic or optical interactions are used to position one or more nanoscale wires on a substrate. In certain cases, physical patterns may be used to position nanoscale wires proximate a surface. For example, nanoscale wires may be positioned on a substrate using physical patterns, for instance, aligning the nanoscale wires using corner of the surface steps or along trenches on the substrate.

The following definitions will aid in the understanding of the invention. Certain devices of the invention may include wires or other components of scale commensurate with nanometer-scale wires, which includes nanotubes and nanowires. In some embodiments, however, the invention comprises articles that may be greater than nanometer size (e.g., micrometer-sized). As used herein, "nanoscopic-scale," "nanoscopic," "nanometer-scale," "nanoscale," the "nano-" prefix (for example, as in "nanostructured"), and the like generally refers to elements or articles having widths or diameters of less than about 1 micron, and less than about 100 nm in some cases. In all embodiments, specified widths can be a smallest width (i.e. a width as specified where, at that location, the article can have a larger width in a different dimension), or a largest width (i.e. where, at that location, the article has a width that is no wider than as specified, but can have a length that is greater).

As used herein, a "wire" generally refers to any material having a conductivity of or of similar magnitude to any semiconductor or any metal, and in some embodiments may be used to connect two electronic components such that they are in electronic communication with each other. For example, the terms "electrically conductive" or a "conductor" or an "electrical conductor" when used with reference to a "conducting" wire or a nanoscale wire, refers to the ability of that wire to pass charge. Typically, an electrically conductive nanoscale wire will have a resistivity comparable to that of metal or semiconductor materials, and in some cases, the electrically conductive nanoscale wire may have lower resistivities, for example, resistivities of less than about 100 microOhm cm ($\mu\Omega$cm). In some cases, the electrically conductive nanoscale wire will have a resistivity lower than about $10^{-3}$ ohm meters, lower than about $10^{-4}$ ohm meters, or lower than about $10^{-6}$ ohm meters or $10^{-7}$ ohm meters.

A "semiconductor," as used herein, is given its ordinary meaning in the art, i.e., an element having semiconductive or semi-metallic properties (i.e., between metallic and non-metallic properties). An example of a semiconductor is silicon. Other non-limiting examples include gallium, germanium, diamond (carbon), tin, selenium, tellurium, boron, or phosphorous.

A "nanoscopic wire" (also known herein as a "nanoscopic-scale wire" or "nanoscale wire") generally is a wire, that at any point along its length, has at least one cross-sectional dimension and, in some embodiments, two orthogonal cross-sectional dimensions less than 1 micron, less than about 500 nm, less than about 200 nm, less than about 150 nm, less than about 100 nm, less than about 70, less than about 50 nm, less than about 20 nm, less than about 10 nm, or less than about 5 nm. In other embodiments, the cross-sectional dimension can be less than 2 nm or 1 nm. In one set of embodiments, the nanoscale wire has at least one cross-sectional dimension ranging from 0.5 nm to 100 nm or 200 nm. In some cases, the nanoscale wire is electrically conductive. Where nanoscale wires are described having, for example, a core and an outer region, the above dimensions generally relate to those of the core. The cross-section of a nanoscopic wire may be of any arbitrary shape, including, but not limited to, circular, square, rectangular, annular, polygonal, or elliptical, and may be a regular or an irregular shape. The nanoscale wire may be solid or hollow. A non-limiting list of examples of materials from which nanoscale wires of the invention can be made appears below. Any nanoscale wire can be used in any of the embodiments described herein, including carbon nanotubes, molecular wires (i.e., wires formed of a single molecule), nanorods, nanowires, nanowhiskers, organic or inorganic conductive or semiconducting polymers, and the like, unless otherwise specified. Other conductive or semiconducting elements that may not be molecular wires, but are of various small nanoscopic-scale dimensions, can also be used in some instances, e.g. inorganic structures such as main group and metal atom-based wire-like silicon, transition metal-containing wires, gallium arsenide, gallium nitride, indium phosphide, germanium, cadmium selenide, etc. A wide variety of these and other nanoscale wires can be grown on and/or applied to surfaces in patterns useful for electronic devices in a manner similar to techniques described herein involving the specific nanoscale wires used as examples, without undue experimentation. The nanoscale wires, in some cases, may be formed having dimensions of at least about 1 micron, at least about 3 microns, at least about 5 microns, or at least about 10 microns or about 20 microns in length, and can be less than about 100 nm, less than about 80 nm, less than about 60 nm, less than about 40 nm, less than about 20 nm, less than about 10 nm, or less than about 5 nm in thickness (height and width). The nanoscale wires may have an aspect ratio (length to thickness) of greater than about 2:1, greater than about 3:1, greater than about 4:1, greater than about 5:1, greater than about 10:1, greater than about 25:1, greater than about 50:1, greater than about 75:1, greater than about 100:1, greater than about 150:1, greater than about 250:1, greater than about 500:1, greater than about 750:1, or greater than about 1000:1 or more in some cases.

A "nanowire" (e.g. comprising silicon and/or another semiconductor material) is a nanoscopic wire that is typically a solid wire, and may be elongated in some cases. Preferably, a nanowire (which is abbreviated herein as "NW") is an elongated semiconductor, i.e., a nanoscale semiconductor. A "non-nanotube nanowire" is any nanowire that is not a nanotube. In one set of embodiments of the invention, a non-nanotube nanowire having an unmodified surface (not including an auxiliary reaction entity not inherent in the nanotube in the environment in which it is positioned) is used in any arrangement of the invention described herein in which a nanowire or nanotube can be used.

As used herein, a "nanotube" (e.g. a carbon nanotube) is a nanoscopic wire that is hollow, or that has a hollowed-out core, including those nanotubes known to those of ordinary skill in the art. "Nanotube" is abbreviated herein as "NT." Nanotubes are used as one example of small wires for use in the invention and, in certain embodiments, devices of the invention include wires of scale commensurate with nanotubes. Examples of nanotubes that may be used in the present invention include, but are not limited to, single-walled nanotubes (SWNTs). Structurally, SWNTs are formed of a single graphene sheet rolled into a seamless tube. Depending on the diameter and helicity, SWNTs can behave as one-dimensional metals and/or semiconductors. SWNTs. Methods of manufacture of nanotubes, including SWNTs, and characterization are known. Methods of selective functionalization on the ends and/or sides of nanotubes also are known, and the present invention makes use of these capabilities for molecular electronics in certain embodiments. Multi-walled nanotubes are well known, and can be used as well.

As used herein, an "elongated" article (e.g. a semiconductor or a section thereof) is an article for which, at any point along the longitudinal axis of the article, the ratio of the length of the article to the largest width at that point is greater than 2:1.

A "width" of an article, as used herein, is the distance of a straight line from a point on a perimeter of the article, through the center of the article, to another point on the perimeter of the article. As used herein, a "width" or a "cross-sectional dimension" at a point along a longitudinal axis of an article is the distance along a straight line that passes through the center of a cross-section of the article at that point and connects two points on the perimeter of the cross-section. The "cross-section" at a point along the longitudinal axis of an article is a plane at that point that crosses the article and is orthogonal to the longitudinal axis of the article. The "longitudinal axis" of an article is the axis along the largest dimension of the article. Similarly, a "longitudinal section" of an article is a portion of the article along the longitudinal axis of the article that can have any length greater than zero and less than or equal to the length of the article. Additionally, the "length" of an elongated article is a distance along the longitudinal axis from end to end of the article.

As used herein, a "cylindrical" article is an article having an exterior shaped like a cylinder, but does not define or reflect any properties regarding the interior of the article. In other words, a cylindrical article may have a solid interior, may have a hollowed-out interior, etc. Generally, a cross-section of a cylindrical article appears to be circular or approximately circular, but other cross-sectional shapes are also possible, such as a hexagonal shape. The cross-section may have any arbitrary shape, including, but not limited to, square, rectangular, or elliptical. Regular and irregular shapes are also included.

As used herein, an "array" of articles (e.g., nanoscopic wires) comprises a plurality of the articles, for example, a series of aligned nanoscale wires, which may or may not be in contact with each other. As used herein, a "crossed array" or a "crossbar array" is an array where at least one of the articles contacts either another of the articles or a signal node (e.g., an electrode).

As used herein, the term "Group," with reference to the Periodic Table, is given its usual definition as understood by one of ordinary skill in the art. For instance, the Group II elements include Mg and Ca, as well as the Group II transition elements, such as Zn, Cd, and Hg. Similarly, the Group III elements include B, Al, Ga, In and Tl; the Group IV elements include C, Si, Ge, Sn, and Pb; the Group V elements include N, P, As, Sb and Bi; and the Group VI elements include O, S, Se, Te and Po.

The following documents are incorporated herein by reference in their entirety for all purposes, and include additional description of teachings usable with the present invention: U.S. Provisional Patent Application Ser. No. 60/142,216, filed Jul. 2, 1999, entitled "Molecular Wire-Based Devices and Methods of Their Manufacture," by Lieber, et al.; International Patent Application No. PCT/US00/18138, filed Jun. 30, 2000, entitled "Nanoscopic Wire-Based Devices, Arrays, and Methods of Their Manufacture," by Lieber, et al., published as WO 01/03208 on Jan. 11, 2001; U.S. Provisional Patent Application Ser. No. 60/226,835, filed Aug. 22, 2000, entitled "Semiconductor Nanowires," by Lieber, et al.; U.S. Provisional Patent Application Ser. No. 60/254,745, filed Dec. 11, 2000, entitled "Nanowire and Nanotube Nanosensors," by Lieber, et al.; U.S. Provisional Patent Application Ser. No. 60/291,896, filed May 18, 2001, entitled "Nanowire Devices Including Emissive Elements and Sensors," by Lieber, et al.; U.S. Provisional Patent Application Ser. No. 60/292,035, filed May 18, 2001, entitled "Nanowire and Nanotube Sensors," by Lieber, et al.; U.S. Provisional Patent Application Ser. No. 60/292,045, filed May 18, 2001, entitled "Nanowire Electronic Devices Including Memory and Switching Devices," by Lieber, et al.; U.S. Provisional Patent Application Ser. No. 60/292,121, filed May 18, 2001, entitled "Semiconductor Nanowires," by Lieber, et al.; U.S. patent application Ser. No. 09/935,776, filed Aug. 22, 2001, entitled "Doped Elongated Semiconductors, Growing Such Semiconductors, Devices Including Such Semiconductors, and Fabricating Such Devices," by Lieber, et al., published as U.S. Patent Application Publication No. 2002/0130311 on Sep. 19, 2002; International Patent Application No. PCT/US01/26298, filed Aug. 22, 2001, entitled "Doped Elongated Semiconductors, Growing Such Semiconductors, Devices Including Such Semiconductors, and Fabricating Such Devices," by Lieber, et al., published as WO 02/17362 on Feb. 28, 2002; U.S. patent application Ser. No. 10/033,369, filed Oct. 24, 2001, entitled "Nanoscopic Wire-Based Devices and Arrays," by Lieber, et al., published as U.S. Patent Application Publication No. 2002/0130353 on Sep. 19, 2002, now U.S. Pat. No. 6,781,166, issued Aug. 24, 2004; U.S. Provisional Patent Application Ser. No. 60/348,313, filed Nov. 9, 2001, entitled "Transistors, Diodes, Logic Gates and Other Devices Assembled from Nanowire Building Blocks," by Lieber, et al.; U.S. patent application Ser. No. 10/020,004, filed Dec. 11, 2001, entitled "Nanosensors," by Lieber, et al., published as U.S. Patent Application Publication No. 2002/0117659 on Aug. 29, 2002; International Patent Application No. PCT/US01/48230, filed Dec. 11, 2001, entitled "Nanosensors," by Lieber, et al., published as WO 02/48701 on Jun. 20, 2002; U.S. Provisional Patent Application Ser. No. 60/354,642, filed Feb. 6, 2002, entitled "Nanowire Devices Including Emissive Elements and Sensors," by Lieber, et al.; U.S. patent application Ser. No. 10/152,490, filed May 20, 2002, entitled "Nanoscale Wires and Related Devices," by Lieber, et al.; International Patent Application No. PCT/US02/16133, filed May 20, 2002, entitled "Nanoscale Wires and Related Devices," by Lieber, et al., published as WO 03/005450 on Jan. 16, 2003; U.S. patent application Ser. No. 10/196,337, filed Jul. 16, 2002, entitled "Nanoscale Wires and Related Devices," by Lieber, et al., published as U.S. Patent Application Publication No. 2003/0089899 on May 15, 2003; U.S. Provisional Patent Application Ser. No. 60/397,121, filed Jul. 19, 2002, entitled "Nanowire Coherent Optical Components," by Lieber, et al.; International Patent Application No. PCT/US03/22061, filed Jul. 16, 2003, entitled "Nanoscale Wires and Related Devices," by Lieber, et al.; U.S. patent application Ser. No. 10/624,135, filed Jul. 21, 2003, entitled "Nanowire Coherent Optical Components," by Lieber, et al.; International Patent Application No. PCT/US03/11078, filed Jul. 21, 2003, entitled "Nanowire Coherent Optical Components," by Lieber, et al., published as WO 2004/010552 on Jan. 29, 2004; U.S. Provisional Patent Application Ser. No. 60/524,301, filed Nov. 20, 2003, entitled "Nanoscale Arrays and Related Devices," by Whang, et al.; U.S. patent application Ser. No. 10/720,020, filed Nov. 21, 2003, entitled "Nanoscale Wires and Related Devices," by Lieber, et al., published as U.S. Patent Application Publication No. 2003/0089899 on May 15, 2003; U.S. patent application Ser. No. 10/734,086, filed Dec. 11, 2003, entitled "Nanowire Coherent Optical Components," by Lieber, et al., published as U.S. Patent Application Publication No. 2004/0213307 on Oct. 28, 2004; U.S. Provisional Patent Application Ser. No. 60/544,800, filed Feb. 13, 2004, entitled "Nanostructures Containing Metal-Semiconductor Compounds," by Lieber, et al.; U.S. Provisional Patent Application Ser. No. 60/551,634, filed Mar. 8, 2004, entitled "Robust Nanostructures," by McAlpine, et al.; U.S. patent application Ser. No. 10/812,653, filed Mar. 29, 2004, entitled "Nanoscopic Wire-Based Devices and Arrays," by Lieber, et al., published as U.S. Patent Application Publication No. 2004/0188721 on Sep. 30, 2004; U.S. Provisional Patent Application Ser. No. 60/579,996, filed Jun. 15, 2004, entitled "Nanosensors," by Wang, et al.; U.S. patent application Ser. No. 10/973,665, filed Oct. 26, 2004, entitled "Nanoscopic Wire-Based Devices and Arrays," by Lieber, et al.; U.S. patent application Ser. No. 10/995,075, filed Nov. 22, 2004, entitled "Nanoscale Arrays and Related Devices," by Whang, et al.; U.S. Provisional Patent Application Ser. No. 60/633,733, filed Dec. 6, 2004, entitled "Nanoscale Wire Based Data Storage," by Lieber, et al.; U.S. patent application Ser. No. 11/058,443, filed Feb. 14, 2005, entitled "Nanoscale Wires and Related Devices," by Lieber, et al.; International Patent Application No. PCT/US2005/004459, filed Feb. 14, 2005, entitled "Nanostructures Containing Metal-Semiconductor Compounds," by Lieber, et al.; U.S. patent application Ser. No. 11/082,372, filed Mar. 17, 2005, entitled "Doped Elongated Semiconductors, Growing Such Semiconductors, Devices Including Such Semiconductors, and Fabricating Such Devices," by Lieber, et al.; and a U.S. patent application filed May 25, 2005, entitled "Nanoscale Sensors," by Lieber, et al.

The following examples are intended to illustrate certain embodiments of the present invention, but do not exemplify the full scope of the invention.

Example 1

Two-dimensional electron and hole gas systems, enabled through band structure design and epitaxial growth on planar substrates, have served as key platforms for fundamental condensed matter research and high performance devices. The analogous development of one-dimensional (1D) electron or hole gas systems through controlled growth on 1D nanostructure substrates, which could open up opportunities beyond existing carbon nanotube and nanowire systems, has not been realized. This example illustrates the synthesis and transport of a 1D hole gas system based on a free-standing germanium/silicon (Ge/Si) core/shell nanowire heterostructure. Room temperature electrical transport measurements showed hole accumulation in undoped Ge/Si nanowire heterostructures, in contrast to control experiments on single component nanowires. Low-temperature studies showed controlled Coulomb blockade oscillations when the Si shell served as a tunnel barrier to the hole gas in the Ge channel. Transparent contacts to the hole gas also have been reproducibly achieved by thermal annealing. In such devices, it was observed that conductance quantization at low temperatures, corresponding to ballistic transport through 1D subbands, where the measured subband energy spacings agree with calculations for a cylindrical confinement potential. In addition, the conductance exhibited little temperature dependence, consistent with a calculation of reduced backscattering in this 1D system, showing that transport is ballistic even at room temperature. In addition, room temperature FET devices can be achieved, in some cases, using certain core/shell nanowire heterostructures. Such devices may have significantly higher scaled transconductance and/or on currents, which, in some instances, may be several times higher than commercially available planar devices.

This example illustrates the design of a 1D hole gas system based on a Ge/Si core/shell nanowire heterostructure. Because there is ~500 meV valence band offset between the Ge core and Si shell in this heterostructure, free holes will accumulate in the Ge channel when the Fermi level lies below the valance band edge of the Ge core. This example demonstrates that transparent contacts to the hole gas are achieved as a result of the band line-up, and obtained long carrier mean free path by eliminating scattering from dopants. With these improvements, ballistic transport through devices up to a few hundred nanometers in length both at low temperature and room temperature was observed.

Ge/Si nanowires were grown as follows. Gold nanoclusters of 5 nm, 10 nm and 15 nm diameters (Ted Pella) were first deposited on oxidized silicon wafers and placed in a quartz tube furnace. Ge nanowire core growth was initiated by nucleation at 315° C. for 1 minute using 10% $GeH_4$ in $H_2$ (30 sccm) and $H_2$ (200 sccm) at 300 torr, followed by axial elongation at 280° C. for 15 minutes and 100 torr. The i-Si shell was deposited within the same reactor immediately following Ge core growth at 450° C. for 5-10 minutes using $SiH_4$ (5 sccm) at 5 torr. The growth rates for the i-Ge core and i-Si shell were about 1 micron/min and 0.5 nm/min, respectively. For the control experiments, i-Ge nanowires were grown using the same procedure as the Ge core, and i-Si nanowires were grown at 435° C. for 20 min using $SiH_4/H_2$ (6/60 sccm) at 60 torr.

Back-gated devices were produced as follows. The nanowires were dispersed in ethanol from growth substrates by sonication, and then deposited on degenerately doped Si substrates with 50 nm thermal oxide layer (n-type, resistivity <0.005 Ohm-cm, Nova Electronics Materials). Electron beam lithography and metal deposition were used to define Ni source/drain electrodes (50 nm thick). To make contacts to the Ge channel, the devices were annealed at 300° C. for 15 seconds in forming gas ($N_2/H_2$, 90/10%) (Heatpulse 610, Metron Technology).

Top-gated devices were produced as follows. Atomic layer deposition was used to deposit $Al_2O_3$ dielectric conformally on Ge/Si nanowire devices prepared in the same way as the back-gated devices. Deposition was carried out at 200° C. using a cycle consisting of 1 s water vapor pulse, 2 s $N_2$ purge, 1 s trimethyl aluminum, and 2 s $N_2$ purge; 50 cycles were used to yield a thickness of 6 nm. The top gate was then defined by electron beam lithography, followed by Cr/Au (5/50 nm) deposition.

Electrical transport measurements were conducted as follows. Room temperature measurements were performed in vacuum at a pressure below 1×04 torr using a cryogenic probe station (TTP-4, Desert Cryogenics). Low temperature measurements were carried out using both the probe station and a He-4 cryostat (Oxford Instruments). The differential conductance G was measured with a lock-in amplifier (SR 830, Stanford Research Systems) using an 11 Hz ac excitation of 200 microvolts superimposed on a dc bias voltage.

The Ge/Si core/shell (FIG. 1A) nanowires were grown using techniques similar to those disclosed in U.S. patent application Ser. No. 10/196,337, filed Jul. 16, 2002, entitled "Nanoscale Wires and Related Devices," by Lieber, et al., published as U.S. Patent Application Publication No. 2003/0089899 on May 15, 2003, incorporated herein by reference, except that both the Ge core and Si shell were not doped. This difference may eliminate some scattering from ionized dopants in the 2-5 nm thick Si shell adjacent to the Ge channel. A thin Si shell was used in this example to facilitate electrical contact to the Ge channel, and/or to reduce the likelihood of dislocations in the shell. The valence band offset of about 500 meV between Ge and Si at the heterostructure interface served as a confinement potential for the quantum well, and free holes may accumulate in the Ge channel when the Fermi level lies below the valance band edge of the Ge core (FIG. 1B). High-resolution transmission electron microscopy studies of the Ge/Si nanowires (FIG. 1C) showed the core (dark)/shell (light) structure. The lattice fringes and sharp interface between Ge and Si showed that the core/shell structure was epitaxial, and was consistent with cross-sectional elemental mapping results. Lower resolution images also indicated that dislocations are not present in these structures. The clean, epitaxial interface in these nanowire heterostructures may produce a smooth confinement potential along the channel. The pseudomorphic strain in the epitaxial core and shell materials may be relaxed along the radial direction, which may yield a type II staggered band alignment. The light hole and heavy hole bands may split due to the effects of strain and confinement.

Figure 1B:
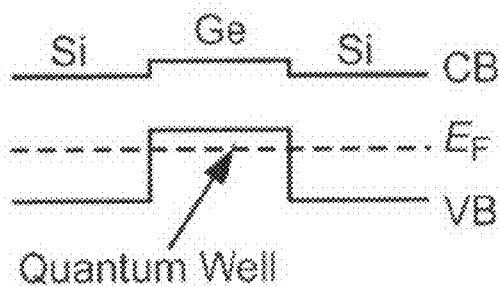
Figure 1C:
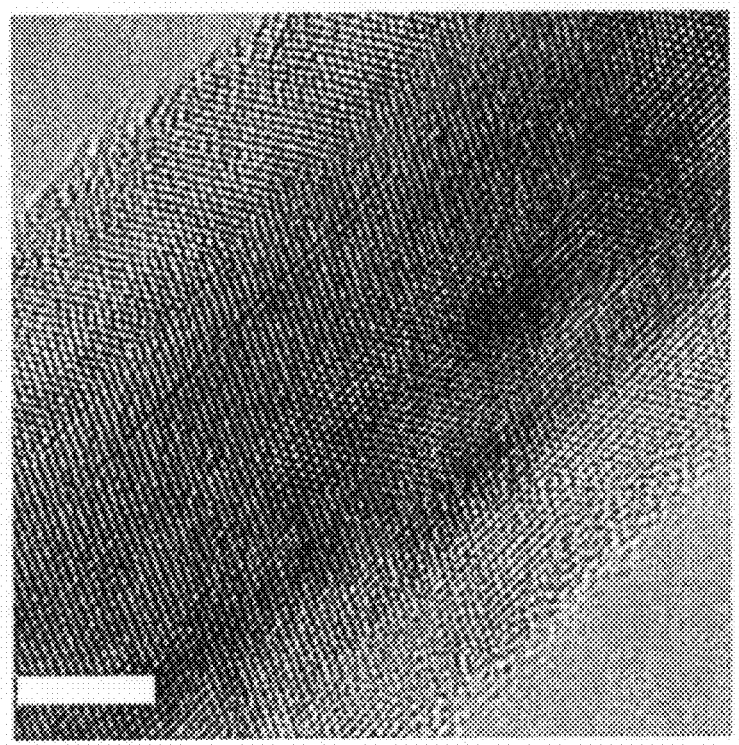

FIG. 1A is a schematic of a cross section through the Ge/Si core/shell structure, and FIG. 1B is a band diagram for a Si/Ge/Si heterostructure. The dashed line indicates the position of the Fermi level, $E_F$, which lies inside the Si band gap and below the Ge valance band edge. FIG. 1C is a high resolution TEM image of a Ge/Si core/shell nanowire with 15 nm Ge (dark gray) core diameter and 5 nm Si (light gray) shell thickness. The contrast between core and shell is due to difference in atomic weights of Ge and Si. Scale bar is 5 nm.

Electrical transport measurements were made on Ge/Si nanowire devices with lithographically-patterned nickel source/drain electrodes and capacitively coupled back-gate electrodes. A brief annealing process was performed after the source/drain fabrication to facilitate contact to the inner Ge channel. Room-temperature current versus source-drain voltage (I-$V_{SD}$) data recorded on a heterostructure with a 10 nm Ge core diameter (FIG. 2A) exhibited a substantial current at zero gate voltage ($V_g=0$), and a decrease in current as $V_g$ is increased from −10 to 10 V. These results showed that the device behaved as a p-type depletion mode field-effect transistor (p-FET), and thus confirmed the accumulation of hole charge carriers. Because both the Ge core and the Si shell are undoped, the existence of a hole gas may be a result of the band line-up as illustrated in FIG. 1B, where the Fermi level is pinned below the Ge valence band edge, due to the combined effect of work function, band offset and interface states. To further probe this phenomenon, control experiments were performed on intrinsic Si (i-Si) and intrinsic Ge (i-Ge) nanowires. Transport measurements (FIG. 2B) showed that both the i-Si and i-Ge nanowires were enhancement mode p-FETs with no carriers at $V_g=0$. The i-Ge nanowire data thus contrasted that obtained for the Ge/Si core/shell structure, even though the i-Ge nanowires were grown under identical conditions to the Ge core in the heterostructure.

Figure 2A:
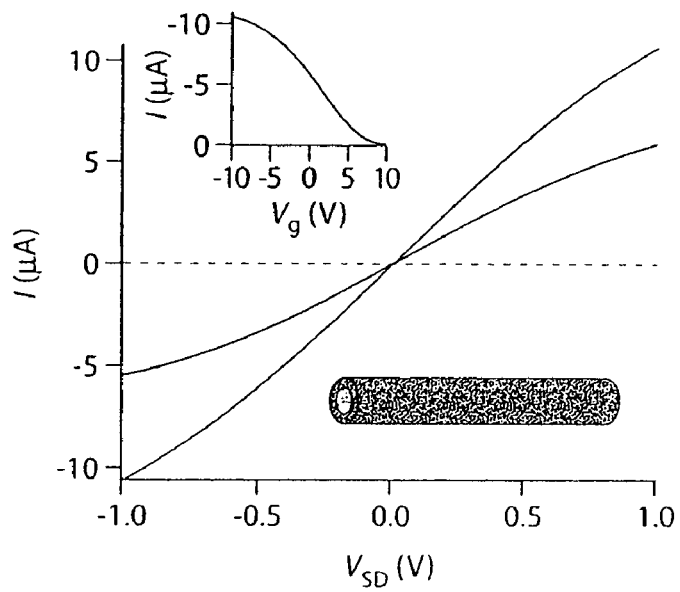
FIGS. 2A-2B illustrate electrical transport in certain Ge/Si nanowires, in accordance with another embodiment of the invention.
Figure 2B:
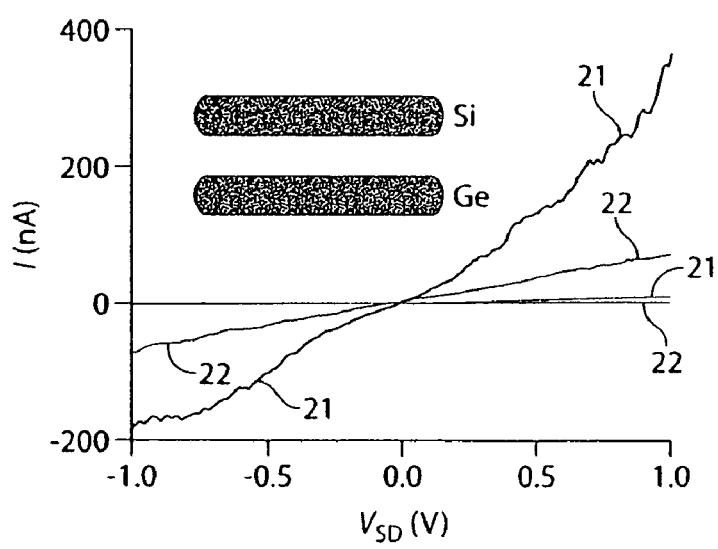

FIG. 2A illustrates I-$V_{SD}$ characteristics recorded on a 10 nm core diameter Ge/Si nanowire device with source drain separation L=1 micron. The different curves corresponded to the back gate voltage $V_g$ values of +10 V (dashed line), 0 (solid line) and −10 V (dotted line). The lower inset is a schematic of a Ge/Si core/shell nanowire, and the upper inset is a plot of I-$V_g$ for the same device at $V_{SD}=-1$ V. FIG. 2B illustrates I-$V_{SD}$ measurements on i-Si (21, 20 nm diameter, 1 micron channel length) and i-Ge (22, 20 nm diameter, 1 micron channel length) nanowires; the data were recorded for $V_g=0$ and −10 V, corresponding to off and on states, respectively. The inset is a schematic of the i-Si and i-Ge nanowires.

For the Ge/Si core/shell nanowire devices fabricated without the annealing process, carriers need to tunnel through the non-conducting Si layer, resulting in a barrier in transport data recorded at low temperatures (inset, FIG. 3A). The Ge/Si devices prepared with Si tunnel barriers at the contacts showed periodic oscillations in I as a function of $V_g$ (FIG. 3A); these are Coulomb blockade oscillations and the device may behave as a single-electron transistor (SET). From the period of the current oscillations in FIG. 3A, the gate capacitance, $C_g$, may be estimated to be 3.2 aF for this 112 nm long device. In FIG. 3B, the differential conductance G=dI/d$V_{SD}$ is plotted vs. $V_{SD}$ and $V_g$ for the same device. These data exhibited well-defined Coulomb diamonds as expected for transport through a single SET (19). In FIG. 3C we show G-$V_{SD}$-$V_g$ for another 385 nm long device with $C_g=15.8$ aF, which also showed well-defined Coulomb diamonds characteristics of transport through a single SET. To verify that the tunnel barriers defining the SET are not caused by defects inside the nanowire, which break the nanowire into multiple islands, and are often observed in lithographically defined wires (21), the measured gate capacitance $C_g$ is plotted in FIG. 3D as a function of the source-drain separation L (measured from SEM images). Notably, the measured $C_g$ agrees well for L>100 nm with the capacitance calculated using a cylinder-on-plane model)

$$C_g = \frac{2\pi\varepsilon\varepsilon_o L}{\cosh^{-1}(h/r)},$$

where h=50 nm is the oxide thickness, r is the radius of the Ge core, and $\epsilon$ (epsilon) is the dielectric constant. For L<100 nm, the measured $C_g$ was generally smaller than that predicted by the simple model, and reflected screening by the metal leads when L is comparable to h. The scaling of $C_g$ with L is a clear demonstration that the tunnel barriers were formed at the contacts, and importantly, that no significant scattering centers appeared to exist inside the channel up to a channel length of at least 500 nm.

FIG. 3 shows coulomb blockade (CB) in the unannealed Ge/Si devices. FIG. 3A shows I-$V_g$ for a 10 nm core diameter Ge/Si nanowire (T=1.5 K, $V_{SD}=0.5$ mV, L=112 nm). The gate capacitance is $C_g=e/\Delta V_{CB}=3.2$ aF, where $\Delta V_{CB}$ is the period of the CB oscillation. In the inset, I-$V_{SD}$ data taken at $V_g=-9.38$ V shows the CB gap. In FIG. 3B, Coulomb diamonds in G-$V_{SD}$-$V_g$ are plotted for the device in A. FIG. 3C shows G-$V_{SD}$-$V_g$ plot for another 10 nm core diameter nanowire with L=385 nm, $C_g=15.8$ aF for this device. FIG. 3D shows scaling of $C_g$ with channel length L. The line is the theoretical prediction based on the cylinder-on-plane model discussed in the text. Black diamonds are experimental data from CB measurements.

In single component semiconductor nanowire devices, a Schottky barrier typically forms at the contact since the Fermi level ($E_F$) lies inside the semiconductor band gap. In contrast, barriers to the hole gas in Ge/Si nanowires were not intrinsic and could be eliminated, since $E_F$ lies outside the Ge bandgap (FIG. 1B). Indeed, annealing the Ge/Si nanowire devices produced reproducible transparent contacts to the hole gas even at low temperatures. The I-$V_{SD}$ data obtained at 4.7 K on an annealed device with a 10 nm core (FIG. 4A, insets) close to depletion ($V_g=10$ V) were linear around $V_{SD}=0$, and thus showed that the contacts were transparent at low temperatures. It should be noted that the depletion mode p-FET behavior with transparent contacts at both room and low temperatures was observed for essentially all of the Ge/Si nanowire heterostructure devices prepared in this way. The reproducibility of this unique contact behavior demonstrates the impact possible through band structure control.

Figure 4A:
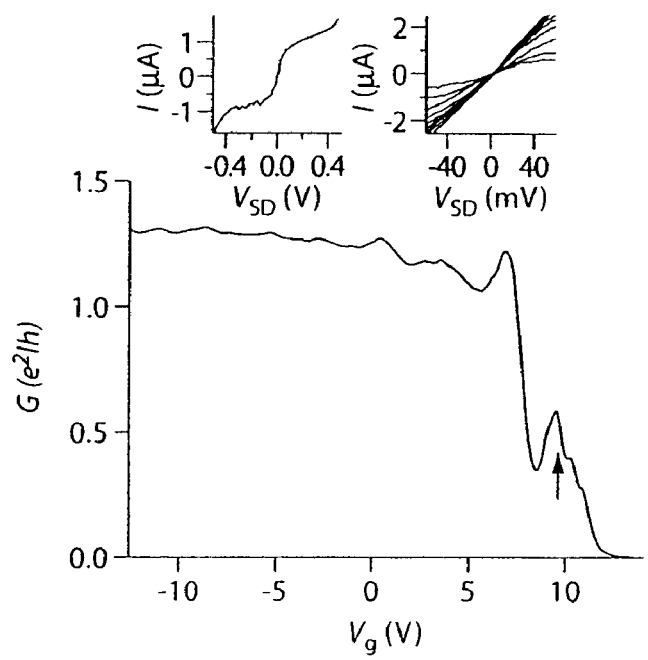
FIGS. 4A-4B illustrate ballistic transport in still another embodiment of the invention.
Figure 4B:
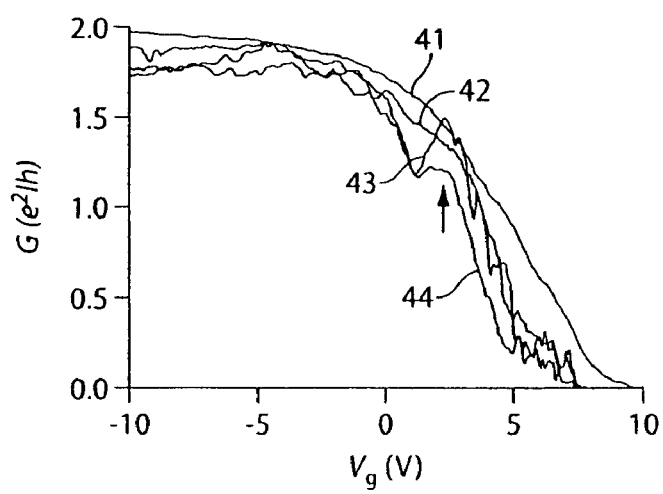

At small bias, the I-$V_{SD}$ curves collapse for $V_g<7$ V (right inset, FIG. 4A). This behavior is highlighted by plotting G vs. $V_g$ (FIG. 4A), where G first rose sharply and then plateaued for $V_g<7$ V. The plateau conductance, ~50 microsiemens, is 0.65 of $2e^2/h$, the value expected for a spin-degenerate single-mode ballistic conductor. Variations in the plateau conductance are suggestive of Fabry-Perot interferences, but are not quantified in this example due to their small amplitude. Studies of additional devices showed very similar results and highlight the reproducible transport properties of the Ge/Si nanowire system. For example, FIG. 4B shows G vs. $V_g$ recorded at different temperatures for another 10 nm core diameter device. At 4.7 K, the device showed a conductance plateau close to $2e^2/h$, which is consistent with data in FIG. 4A and the value for a single-mode ballistic conductor. Notably, increasing temperature up to 300 K yielded little change in the value of the conductance plateau. This implies that even at room temperature, only a single 1D subband participates in transport, and that the mean free path exceeds the channel length of 170 nm; that is, transport through the Ge/Si nanowire remains ballistic up to at least this length scale.

FIG. 4A shows G-$V_g$ recorded at 4.7 K for a 10 nm core Ge/Si nanowire with L=350 nm. The left inset) is the I-$V_{SD}$ curve recorded at $V_g=10$ V. The right inset is the I-$V_{SD}$ data recorded at $V_g$ from 10 to −10 V in 1 V steps. FIG. 4B shows G-$V_g$ data recorded for another Ge/Si nanowire device (L=170 nm) measured at different temperatures: 41, 42, 43, 44 correspond to 300, 50, 10, and 4.7 K, respectively. The conductance value on the plateau decreased slightly with decreasing temperature. This reduction may be due to small potential fluctuations inside the channel, although other factors such as changes in the contact resistance or many-body effects may also be possible. The vertical arrows in (A) and (B) highlight the 0.7 structure.

These results contrast data from planar 2DHG (two-dimensional hole gas) devices, where the mobility decreases dramatically with increasing temperature due to scattering with acoustic phonons. In a 1D system, acoustic phonon scattering may be suppressed due to the reduced phase space for back-scattering. In the Ge/Si nanowires, Fermi's golden rule may be used to estimate the acoustic phonon scattering rate as $$\frac{1}{\tau_{ap}} = \frac{\pi k_B T \Xi^2}{\hbar \rho V_s^2} D(E_F) \quad (1)$$

where $\Xi$ (Xi) is the deformation potential, $\rho$ (rho) is the mass density, and $v_s$ is the velocity of sound. The density of states can be calculated as $$D(E) = \frac{\sqrt{2m^*}}{\pi \hbar \sqrt{E}} \frac{1}{\pi r^2}$$

for the first subband using the effective mass for heavy holes, $m^*=0.28 m_e$, where $m_e$ is the free electron mass. This results in $\tau_{ap} \sim 4.9 \times 10^{-12}$ s at room temperature for a 10 nm core diameter nanowire at $E_F=10$ meV using an average sound velocity of 5400 m/s and deformation potential of 3.81 eV for Ge. The mean free path calculated using this value of $\tau_{ap}$ and the Fermi velocity, $v_F=\sqrt{2E_F/m^*} \sim 1.1 \times 10^5$ m/s, was 540 nm. This estimate is consistent with the experimental results, and moreover, suggests that room-temperature ballistic transport in Ge/Si nanowires is possible on a 0.5 micron scale, assuming other scattering processes are suppressed. Reduced acoustic phonon scattering in 1D illustrates room temperature ballistic transport in Ge/Si nanowires.

Figure 5A:
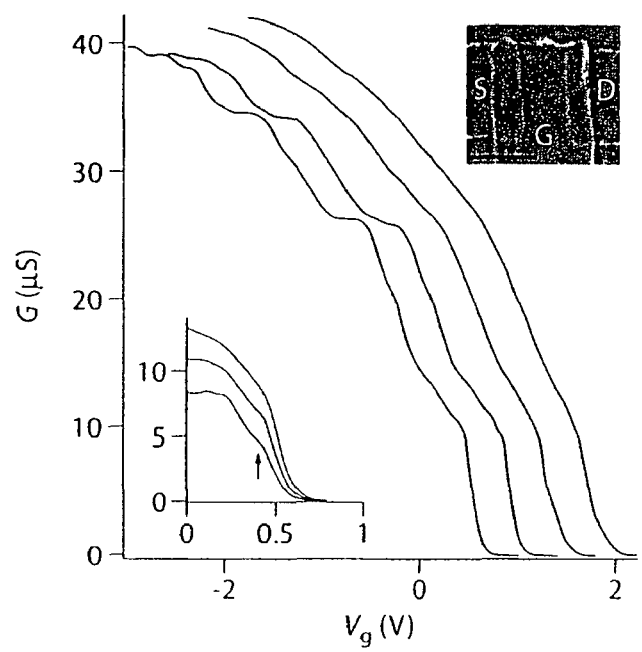
FIGS. 5A-5C illustrate various properties of certain Ge/Si nanowires of still another embodiment of the invention.
Figure 5B:
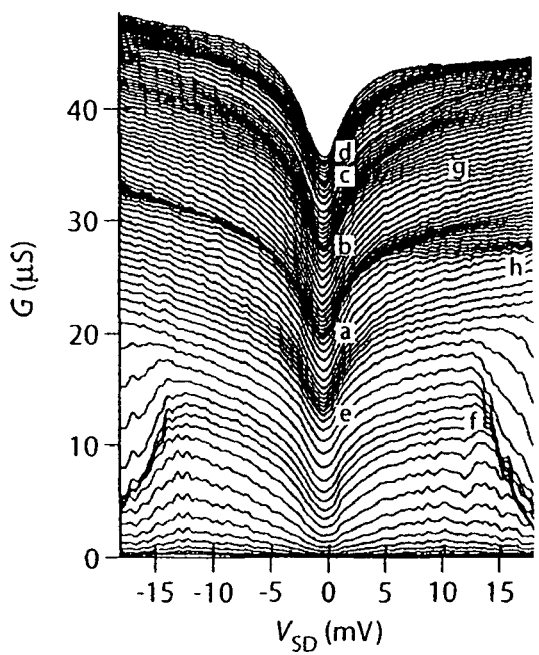

In addition, in this example devices with a top-gate structure were studied, which increases the gate coupling, in order to probe transport through more than one subband. $G$-$V_g$ data recorded on a 400 nm long device. FIG. 5A shows four distinct conductance plateaus at 5 K. These plateaus to transport may be attributed through the first four subbands in the Ge/Si nanowire, and this assignment may be confirmed by plotting $G$-$V_{SD}$ for different values of $V_g$ (FIG. 5B). In this plot, the conductance plateaus appeared as dark regions, labeled as a-d, where several $G$-$V_{SD}$ curves at different $V_g$ overlap, since $V_g$ does not affect G in the plateau regions. At large $V_{SD}$ these integer plateaus evolve into "half" plateaus (f-g) when the source and drain chemical potentials cross different subbands. For example, the 0.5 plateau, appearing as the dark region labeled corresponded to the case where the source potential drops below the first subband bottom while the drain potential still lies above it. Similarly, feature g corresponded to the 1.5 plateau, which evolved from the second (b) and first (a) subbands. The small cusp feature near zero-bias in the $G$-$V_{SD}$ data may be due to shallow potential barriers with heights of a few meV. The potential barriers may be caused by non-optimal fabrication process in these top-gated devices, since they are absent in the bottom gated devices studied earlier. The existence of shallow barriers also may explain the thermal activation behavior observed in G measured at zero-bias (but not in G measured outside the cusp at 8 mV), and values of the conductance on the plateaus less than multiples of $2e^2/h$.

The assignment of these features to 1D subbands in the Ge/Si nanowires was further analyzed by quantifying the level spacings. Such features appeared more pronounced after numerically differentiating G against $V_g$. A plot of the transconductance, $dG/dV_g$, as a function of $V_{SD}$ and $V_g$ (FIG. 5C) showed zero or low values at conductance plateaus and high values in the transition regions between plateaus, which are highlighted by dashed lines in the figure. The subband spacings were obtained directly from these data as the $V_{SD}$ values at the apexes of the full plateaus (i.e., the extrapolated intersections of the dashed lines), which yielded $\Delta E_{1,2}=25$ mV and $\Delta E_{2,3}=30$ mV. For comparison, the subband spacings were calculated using an effective mass model with a cylindrical confinement potential with radius r to approximate the Ge/Si nanowire structure. The energy levels of the 1D modes due to radial confinement were $$E = \frac{\hbar^2 u_{ni}^2}{2m^* r^2} \quad (2)$$

where $u_{ni}$ is Bessel function's $J_n(x)$'s $i^{th}$ zero point, and $m^*$ is the hole effective mass as discussed above. For a nanowire with 14 nm Ge core diameter, $\Delta E_{1,2}=25$ mV and $\Delta E_{2,3}=32$ mV. These values were in good agreement with the experimental data (FIG. 5C), and thus provides support for the assignment of discrete 1D subbands in the Ge/Si nanowire heterostructures.

Figure 5C:
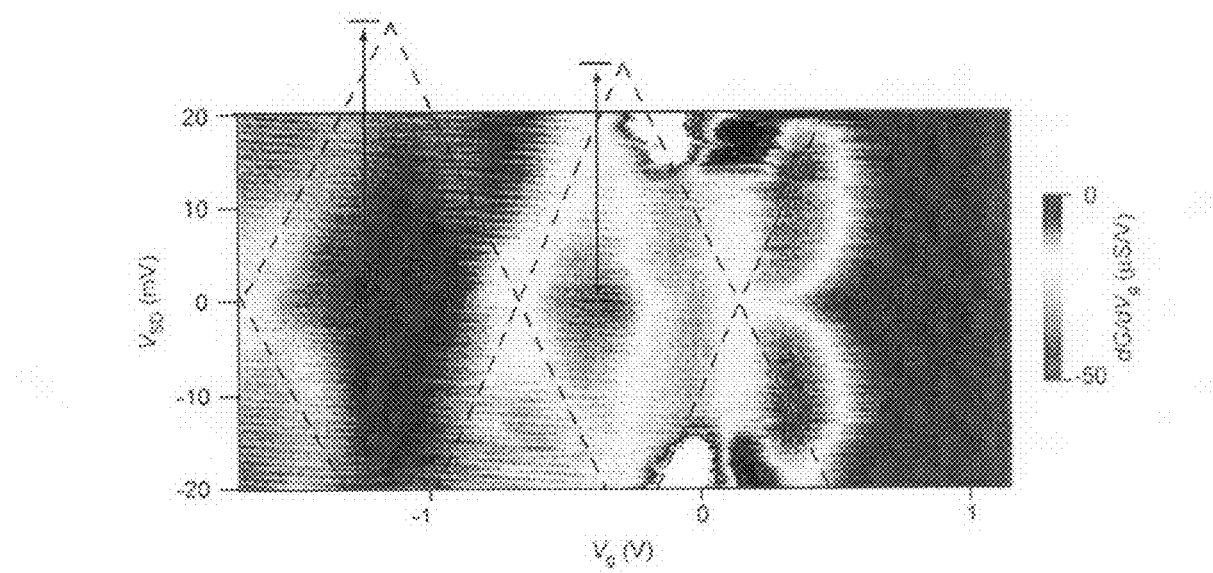

FIG. 5A illustrates $G$-$V_g$ recorded at different temperatures for a top-gated device ($V_{SD}=8$ mV). The curves (from left to right) correspond to 5, 10, 50, and 100 K, respectively. Data was offset horizontally for clarity. The upper inset is a SEM image of the sample showing the source (S) drain (D) and the top gate (G) electrodes; scale bar is 500 nm. The lower inset shows zero-bias $G$-$V_g$ recorded at (left to right) 5, 10, and 20 K; axes have the same units as the main figure. The vertical arrow highlights the "0.7 structure." FIG. 5B illustrates $G$-$V_{SD}$ plots recorded at $V_g=0.8$ to $-3.5$ V in 50 mV steps with no offset applied (T=5 K). Data taken in a different thermal cycle from FIG. 5A. Plateaus, labeled a-g, which appear dark due to accumulation of $G$-$V_{SD}$ traces, are discussed above. Feature h evolves from the first plateau a and the 0.7 structure e. FIG. 5C shows transconductance $dG/dV_g$ as a function of $V_{SD}$ and $V_g$ for data in FIG. 5B. The dashed lines are guides indicating the evolution of conductance modes with $V_{SD}$ and $V_g$. The vertical arrows highlight values of $\Delta E_{1,2}$ and $\Delta E_{2,3}$.

A reproducible feature was observed with a conductance value about 0.7 times the first plateau in the bottom-gated (FIG. 4, vertical arrows) and top-gated (FIG. 5A, inset; FIG. 5B, labeled) devices. Similar features, termed "0.7 structure," have been observed previously on quantum point contacts and quantum wires formed in clean 2DEG samples (two-dimensional electron gas). This feature is generally believed to be caused by spontaneous spin polarization in low-dimensional interacting electron gas systems due to the formation of a spin gap or a localized spin. Temperature dependent data recorded on a back-gated Ge/Si device (FIG. 4B) showed that the 0.7 feature initially increased in magnitude and then broadened as the temperature was increased to 50 K, consistent with the spin-gap hypothesis. These results suggest that the "0.7 structure" is not restricted to electron gas samples, but a universal phenomenon in 1D systems. In this regard, the heavier effective mass of holes in the Ge/Si nanowires compared to electrons may yield a larger interaction parameter.

Figure 6A:
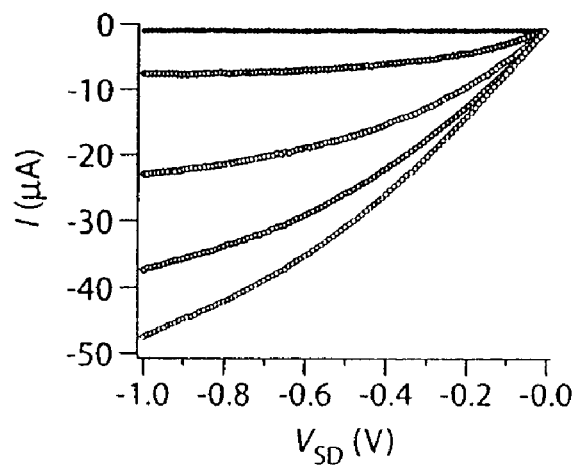
FIGS. 6A-6B illustrate various properties of certain Ge/Si nanowire field effect transistors (FETs), in yet another embodiment of the invention.
Figure 6B:
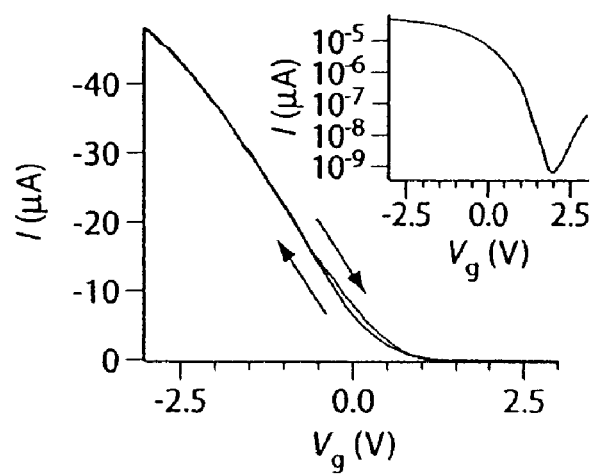

In another experiment, high performance FET devices were fabricated and studied. FIGS. 6A and 6B show data for a top-gated Ge/Si nanowire device with a 1 micron channel length at room temperature. At $-1$ V bias, the device exhibited a maximum "on" current $I_{on}$ of 48 microamps (FIG. 6A), a transconductance $G_m=dI/dVg$ of 16 microsiemens (FIG. 6B), and an on/off ratio of about $10^5$. Given the diameter of the nanowire as the relevant size, the scaled $I_{on}$ and $G_m$ were estimated at about 3 microamps/micron and about 1 microsiemen/micron, respectively. The elimination of ionized dopant scattering, suppression of acoustic phonon scattering, and/or surface passivation by the Si shell may contribute to the higher performances observed here. In addition, high device yields were observed in these experiments.

In conclusion, band-structure design and controlled epitaxial growth was used to create a 1D hole gas system in Ge/Si core/shell nanowire heterostructures. Ballistic transport was observed through individual 1D subbands due to confinement of carriers in the radial direction. Significantly, the conductance showed little temperature dependence, suggesting a room temperature carrier mean free path on the order of several hundred nanometers. More generally, this method can be generalized to create 1D electron gas systems in other nanowire heterostructures, and the long mean free path and synthetic tunability of these 1D electron and hole gas systems may make them attractive for fundamental studies relevant to spin and quantum electronics and device applications.

Example 2

Figure 7A:
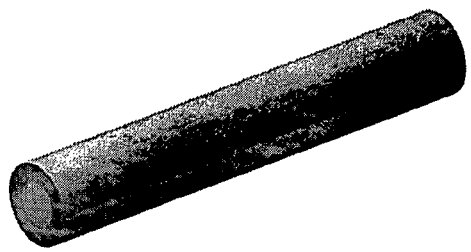
FIGS. 7A-7E illustrate various NWFETs produced according to one embodiment of the invention.
Figure 7B:
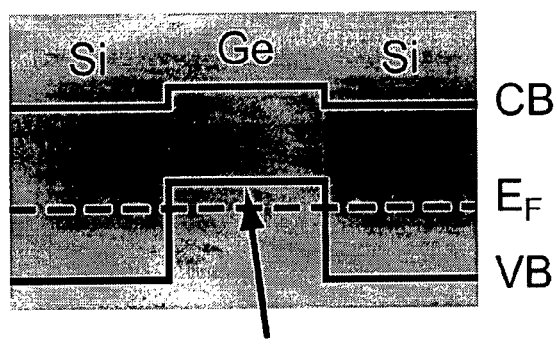
Figure 7C:
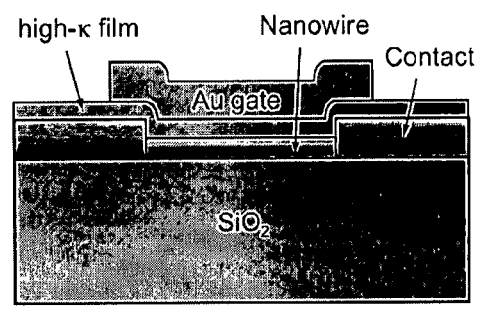
Figure 7D:
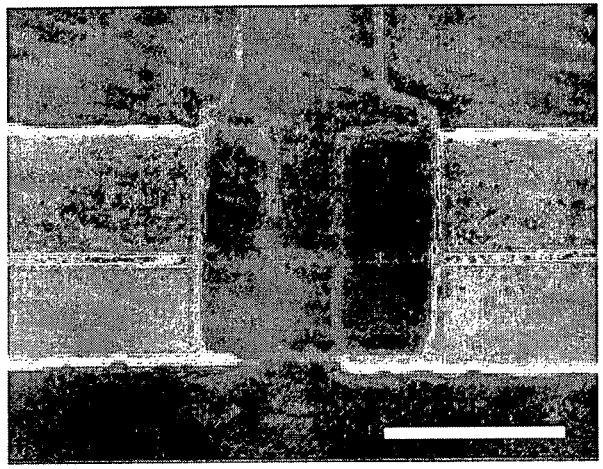
Figure 7E:
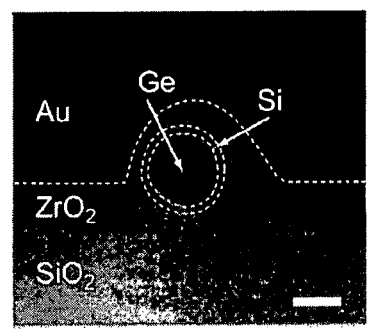

Silicon and germanium nanowires have been the focus of recent studies of one-dimensional (1D) FETs. However, metal contacts to single-component nanowires generally produce Schottky barriers that limit device performance, and moreover, scattering from charged dopants can also reduce the intrinsic mobility of these nanowire devices. In contrast, various aspects of the present invention show transparent contacts and low-bias ballistic transport in undoped Ge/Si core/shell nanowire heterostructures (FIGS. 7A and 7B; see also Example 1), with an estimated scattering mean free path of ~500 nm. As will be shown in this example, the 1D subband spacing in the typical 15-nm core Ge/Si nanowires determined through both experimental measurements and theoretical calculations was ~25 meV, and thus at room temperature several sub-bands may participate in NWFET transport. While the Ge/Si nanowire devices need not strictly be 1D, the limited number of conduction channels and clean material structure can benefit performance through, for example, a reduction in scattering. To explore the potential of Ge/Si nanowire heterostructures as high-performance FETs in this example, devices were fabricated using thin $HfO_2$ or $ZrO_2$ high-k gate dielectrics and metal top gate electrodes (FIGS. 7C and 7D). Cross-sectional transmission electron microscopy (TEM) images (FIG. 7E) showed that both the high-k and metal top gate conformed to the approximately circular cross-section of the nanowire, and also verified the Ge/Si core/shell structure. The conformal top gate structure approached an ideal cylindrical gate geometry, and together with the high-k dielectrics, produced a much more efficient gate response than previous studies using lower-k $SiO_2$ dielectric and planar back gates.

Fabrication and measurement of Ge/Si NWFET devices in this example were as follows. The growth of epitaxial core/shell Ge/Si nanowires and fabrication of Ni-contacted NWFETs are described above. The nanowires prepared here had an average core diameter of 14.6 nm and a Si shell thickness of 1.7 nm, and normally exhibited a <110> growth direction. A thin high-k dielectric film was deposited on the devices using an atomic layer deposition (ALD) process. 30 cycles for $HfO_2$ deposition and 50 cycles for $ZrO_2$ were used at 110° C. with each cycle having a 1 s water vapor pulse, 5 s $N_2$ purge, 3 s precursor, and 5 s $N_2$ purge. Tetrakis(dimethylamino) hafnium [$Hf(N(CH_3)_2)_4$], and tetrakis(dimethylamino) zirconium were used as precursors. Electron beam lithography was used to define the top gate, followed by thermal evaporation of either Cr/Au (5 nm/50 nm) or Al (50 nm). The devices were measured at room temperature in vacuum ($P<10^{-4}$ torr) with a probe station (TTP-4, Desert Cryogenics).

Cross-sectional TEM samples were prepared as follows. Dry-transfer from the growth substrate was used to deposit aligned nanowire arrays with inter-nanowire spacings of several micrometres on a $Si/SiO_2$ wafer. The wafer was then coated with a thin film of $ZrO_2$ high-k dielectric and Au metal as described above. Cross-sectional TEM samples were prepared by cutting the wafer into thin slices, followed by mechanical polishing and further thinning by ion milling. TEM images were taken by a JEOL 2010F high-resolution microscope.

FIG. 7 shows a Ge/Si core/shell NWFET produced as described above. FIG. 7A is a schematic of a Ge/Si core/shell nanowire. FIG. 7B is a cross-sectional diagram showing the formation of hole-gas in the Ge quantum well confined by the epitaxial Si shell, where CB is the conduction band and VB is the valence band. The dashed line indicates the Fermi level, $E_F$. The valence band offset of ~500 meV between Ge and Si served as a confinement potential to the hole-gas. FIG. 7C is a schematic of a NWFET device with high-k dielectric layer and Au top gate. FIG. 7D is a top-view SEM image of a typical device. The Au top gate overlapped with the Ni source/drain electrodes to ensure full coverage of the channel. The scale bar is 500 nm. FIG. 7E is a cross-sectional TEM image of a device prepared using a 7 nm $ZrO_2$ dielectric. The dotted lines are guides to the eye showing boundaries between different materials denoted in the image. The nanowire is tilted off the imaging axis. The scale bar is 10 nm.

Figure 8A:
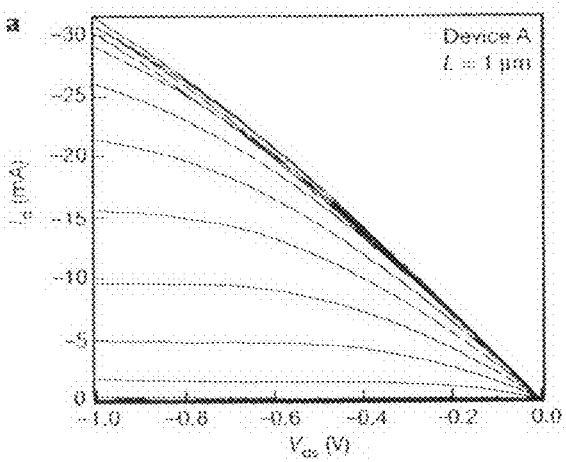
FIGS. 8A-8C illustrate characteristics of various NWFETs, produced according to certain embodiments of the invention.
Figure 8B:
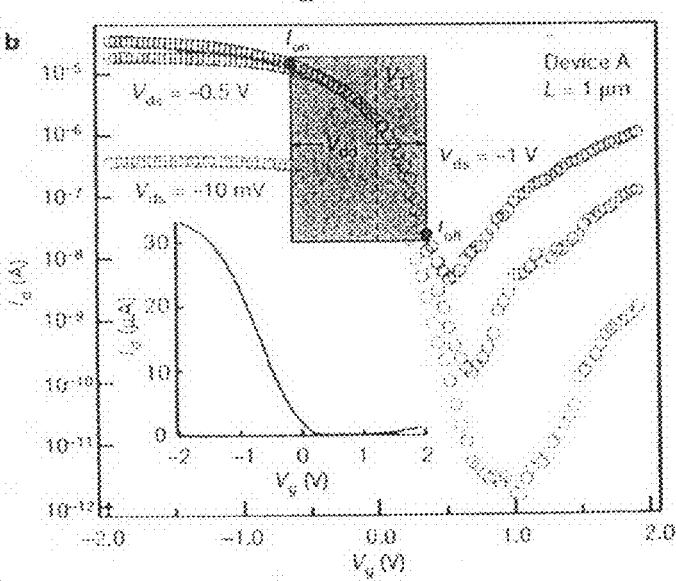

Typical output and transfer characteristics recorded from a Ge/Si device fabricated in this way with a channel length, L=1 micrometer and a total diameter of 18 nm (device A) are shown in FIGS. 8A and 8B. The family of $I_d$-$V_{ds}$ curves (FIG. 8A) showed that the drain current $I_d$ first increased then saturated with increasingly negative drain voltage, similar to a conventional long channel MOSFET. These data also showed that $I_d$ increased as the gate voltage $V_g$ decreases from 1 to −2 V, and thus that the device acted as a p-type depletion-mode FET. This p-type FET behavior was expected from the band diagram in FIG. 7B, where the Fermi level lies below the Ge valence band edge in the absence of a gate. The $I_d$-$V_g$ transfer curve recorded for the drain bias voltage $V_{ds}$=−1 V (FIG. 8B) demonstrated that the NWFET has a peak transconductance, $g_m=dI_d/dV_g$, of 26 microsiemens. In addition, the device exhibited a maximum drain current $I_{d(max)}$ of 35 microamps at $V_g$=−2 V.

The on current $I_{on}$ for a FET device is usually determined at $V_g=V_{ds}=V_{dd}$, where $V_{dd}$ is the power supply voltage and equals 1 V in this case. Following conventions in planar devices, the on and off currents were defined as the values measured at $V_{g(on)}=V_T-0.7 V_{dd}$ and $V_{g(off)}=V_T+0.3 V_{dd}$, so that 30% of the $V_g$ swing above the threshold voltage $V_T$ was applied to turn the device off, while the remaining 70% sets the operation range of the on state (FIG. 8B). From FIG. 8B, $I_{on}$=14 microamperes can be obtained for this 1-micrometer-long device. Significantly, the scaled values of $g_m$ and $I_{on}$, 1.4 mS micrometers$^{-1}$ and 0.78 mA micrometers$^{-1}$, using the total nanowire diameter as the device width, already exceeded the values of 0.8 mS micrometers$^{-1}$ and 0.71 mA micrometers$^{-1}$ reported in much shorter, sub-100-nm silicon p-MOSFETs employing high-k dielectrics.

Figure 8C:
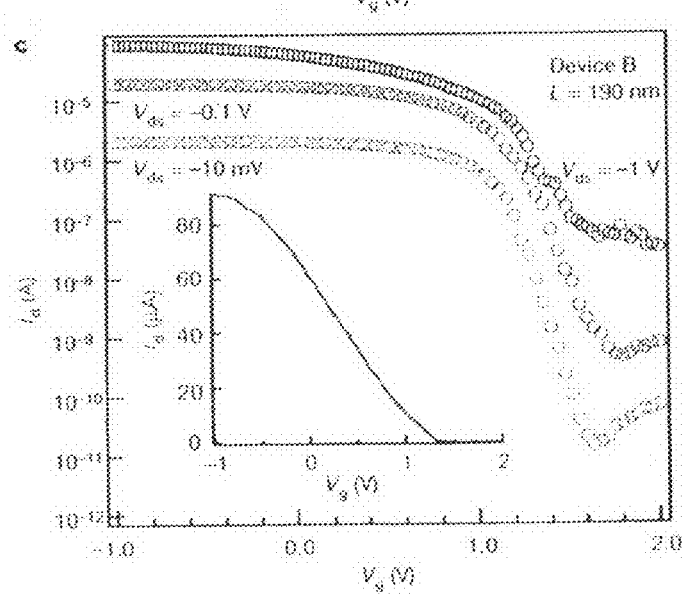

In addition, in this example, a large number of Ge/Si NWFET devices were prepared with L varying from 1 micrometer to 190 nm; essentially all of these devices exhibited high-performance behavior and show the reproducibility of both the Ge/Si nanowires and contacts to this material. Representative data obtained from a L=190 nm device (device B), which should exhibit larger $g_m$ and $I_d$ values owing to reduced channel resistance, are shown in FIG. 8C. These data yielded $g_m$=60 microsiemens, $I_{on}$=37 microamperes ($V_{dd}$=1 V), and $I_{d(max)}$=91 microamperes, and corresponded to scaled values of $g_m$ and $I_{on}$ of 3.3 mS micrometers$^{-1}$ and 2.1 mA micrometers$^{-1}$, respectively. Notably, these values were more than twice that achieved in the longer channel device and are 3 to 4 times greater than state-of-the-art Si p-MOSFETs. The geometric gate capacitance per unit area in these NWFETs, 44 fF micrometers$^{-2}$, was about 29% larger than the 34 fF micrometers$^{-2}$ in these Si p-MOSFETs. Therefore the large gain in $g_m$ and $I_{on}$ cannot be accounted for by an increase in gate capacitance alone. Moreover, the hole mobility for this Ge/Si NWFET, 730 cm$^2$ V$^{-1}$ s$^{-1}$, extracted at the linear region ($|V_{ds}|$=10 mV) from the peak $g_m$=3 microsiemens at $|V_g - V_T|$=0.13 V using the charge control model, represented an improvement of more than a factor of ten over that of the Si p-MOSFET with HfO$_2$ gate dielectric (50-60 cm$^2$ V$^{-1}$ s$^{-1}$), and also was more than twice the reported low-field mobility of Ge and strained SiGe heterostructure PMOS devices. Improved mobility was observed for NWFETs with channel lengths from 0.19 to 1 mm (FIG. 11), with an average of 640 cm$^2$ V$^{-1}$ s$^{-1}$. These improvements over planar device structures thus verified the performance benefit due to the quasi-1D transport in clean Ge/Si heterostructure nanowires.

Figure 11:
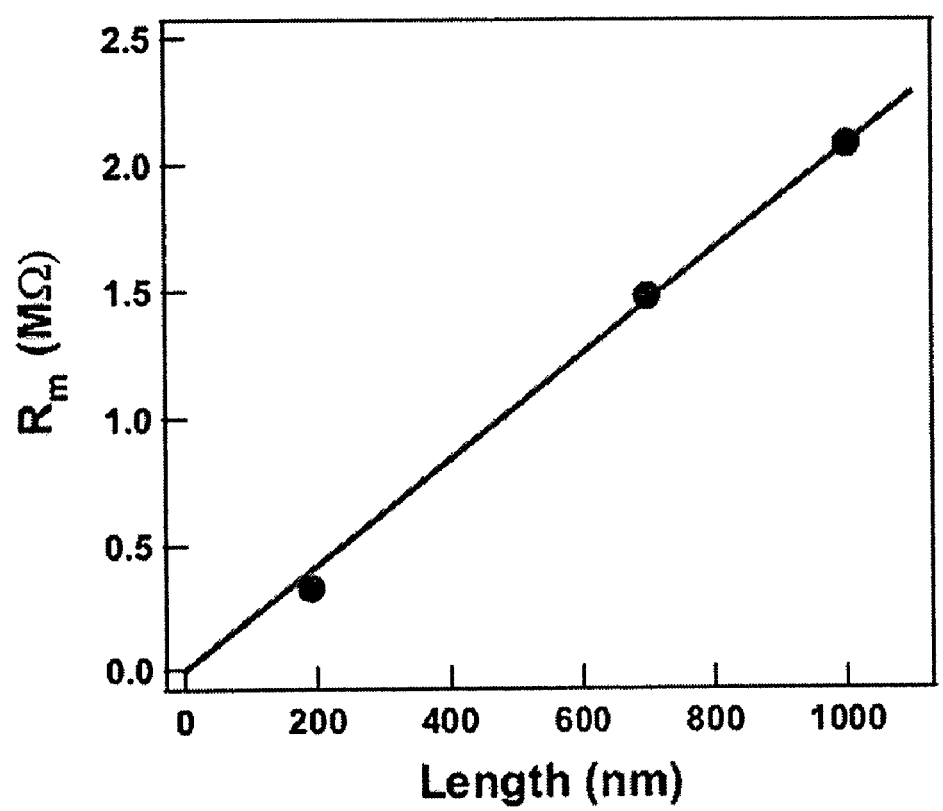
FIG. 11 illustrates length dependence of the nanowire inverse-transconductance, in another embodiment of the invention.

Referring to FIG. 11, this figure shows length dependence of the nanowire inverse-transconductance. The inverse transconductance, $R_m$=1/$g_m$, was calculated from the linear scale transconductance, $g_m$, at a bias voltage of 10 mV and scales linearly with channel length from 190 nm to 1 micrometer. The linear increase was consistent with the charge control model at low bias, $$\mu = \frac{g_m}{V_{ds}} \frac{L^2}{C},$$

since the gate capacitances per unit length, C/L=800 aF/micrometer, was a constant in these devices (i.e., the devices have the same dielectric thickness and top gate geometry). The average mobility determined from these data is 640 cm$^2$/V s.

The subthreshold region of the $I_d$-$V_g$ data was also analyzed and yielded values of the slope, S=-[d(log$_{10}I_d$)/dV$_g$]$^{-1}$, of 105 and 100 mV per decade for the L=1 micrometer and 190 nm NWFETs, respectively, for $V_{ds}$=-1 V (FIGS. 8B and 8C). Similar values of S were obtained from $I_d$-$V_g$ data recorded on both devices using $V_{ds}$ from -0.01 to -1 V, which indicated the absence of significant short-channel effects for devices down to at least L=190 nm and good $V_g$ control of the channel potential over the competing effect of drain-induced barrier lowering at larger biases.

In general, an FET with a small S may be desirable for modern logic circuits, as it reduces the off state current and minimizes static power dissipation. The value of S can be estimated by 2.3 $k_BT/e\alpha$, where T is temperature and $\alpha$ is the gate-coupling factor, which yielded a room temperature minimum ($\alpha$=1) of 60 mV per decade. The values of S determined for the L=1 mm and 190 nm Ge/Si NWFETs were higher than the best value (140 mV per decade) reported previously for NWFETs but still larger than the theoretical minimum. The nonideal gate coupling ($\alpha$<1), which yielded this larger S value, may be due to a finite trap state density at the nanowire/high-k interface. Optimization of the high-k deposition process during fabrication or growth of a cylindrical high-k shell on the Ge/Si nanowire before fabrication further can result in improved interface quality.

FIG. 8 shows certain characteristics of high-performance Ge/Si NWFET. FIG. 8A shows $I_d$-$V_{ds}$ data for device A (L=1 micrometer, 4 nm HfO$_2$ dielectric) with $V_g$=-2 to 2 V in 0.25 V steps from top to bottom. FIG. 8B shows $I_d$-$V_g$ for device A with the top, middle, and bottom data points corresponding to $V_{ds}$ values of -1, -0.5 and -0.0V, respectively. The leakage current through the gate electrode ($I_g$) was ~10$^{-10}$ A, which excludes $I_g$ as source of increase in $I_d$ at $V_g$>~0.5 V. The inset is a linear scale plot of $I_d$ versus $V_g$ measured at $V_{ds}$=-1 V. The shaded area defines the 1 V gate voltage window, where $V_T$ was determined from the intercept of the tangent of maximum slope (linear transconductance) region of the $I_d$-$V_g$ curve. FIG. 8C shows $I_d$-$V_g$ data for device B (L=190 nm, 4 nm HfO$_2$ dielectric) with top, middle, and bottom data points corresponding to $V_{ds}$ values of -1, -0.1 and 0.01 V, respectively. The inset is a linear scale plot of $I_d$ versus $V_g$ measured at $V_{ds}$=-1 V.

An important benchmark of transistor performance is the intrinsic delay, tau=CV/I, where C is the gate capacitance, V=$V_{dd}$, and I is on current $I_{on}$. As defined, tau represents the fundamental RC (where R is the device resistance and C is the capacitance) delay of the device and provides a frequency limit for transistor operation that is relatively insensitive to gate dielectrics and device width, and thus represents a good parameter for comparing different types of devices. The calculated intrinsic delays are 57 and 4 ps for devices A and B in FIG. 8, respectively, where C was determined by numerical simulation (see below). A summary of the results from seven Ge/Si NWFETs versus L and the corresponding scaling for Si MOSFETs (FIG. 9A) shows several points. First, the data showed a speed advantage at a given L for the Ge/Si NWFETs versus Si p-MOSFETs. For example, the intrinsic delay for a 190 nm Si planar device was larger than 10 ps, about three times longer than device B. Second, the delay time for the 190 nm Ge/Si device was about the same as that of similar-length CNTFET devices. Also, length scaling of tau was more favorable for the Ge/Si NWFETs than Si MOSFETs (that is, slope of ~1.5 versus ~1.1). This difference may be attributed to a suppression of scattering in the quasi-1D quantum confined Ge/Si nanowires versus MOSFETs.

Calculation of mobility and intrinsic delay CV/I was performed as follows. The gate capacitance, C, was calculated using numerical simulations on nanowire devices with a Ge core diameter of 14.6 nm and a Si shell thickness of 1.7 nm; these parameters were determined for devices using cross-sectional TEM measurements. The thickness for HfO$_2$ (k=23) and ZrO$_2$ (k=20) were 4 and 7 nm, respectively. Assuming the top gate conformally covered the top half of the nanowire as indicated by the cross-sectional TEM image, gate capacitances per unit length of $C_L$=800 aF micrometers$^{-1}$ (HfO$_2$) and 580 aF micrometers$^{-1}$ (ZrO$_2$) were obtained from two-dimensional electrostatic simulations (Quickfield, Tera Analysis, Denmark). When scaled using the total diameter of the nanowire, gate capacitances per unit area of 44 and 32 fF micrometers$^{-2}$ for the HfO$_2$ and ZrO$_2$ dielectrics used were obtained, respectively. It should be noted that this calculation tends to overestimate the gate coupling capacitance because it does not include the effect of quantum capacitance from the finite density of states in the 1D Ge channel, and does not consider the formation of interfacial silicon oxide layer that tends to reduce the k value. Mobility was calculated from low-bias $g_m$ based on the charge control model:

$$\mu = \frac{g_m}{V_{ds}} \frac{L^2}{C},$$

where L is device gate length. FIG. 11 shows a linear relationship between the inverse transconductance and the channel length for three different devices, consistent with this model. For the intrinsic delay $CV/I_{on}$, $V=V_{dd}=1$ V is the power supply voltage for both the $V_g$ swing and saturation bias.

To capture the off state leakage current property, the $CV/I_{on}$ versus $I_{on}/I_{off}$ ratio was studied. Full control of the threshold voltage was assumed, allowing a window of $V_{g(on)}-V_{g(off)}=V_{dd}=1$ V to move along the $V_g$ axis and define a pair of $I_{on}$ and $I_{off}$ value from the $I_d$-$V_g$ data plot. The CV/In versus $I_{on}/I_{off}$ data for devices A and B (FIG. 9B) showed the trade-off between high speed and small leakage. The smallest tau was observed at the largest $I_{on}$, although this corresponded to a minimum on/off ratio. As the on/off ratio increased, tau also increased, until the on/off ratio reached a maximum limited by ambipolar conduction (see below). The arrows corresponded to the intrinsic delay values obtained from the 70-30% criteria used to define $I_{on}$ in the benchmark plot in FIG. 9A, and showed that the $I_{on}/I_{off}$ ratios for the A and B devices are 100 and 580, respectively. On/off ratios for the rest of the devices in FIG. 9A all were within this range. The on/off ratio was expected to reach $10^4$-$10^5$ as the subthreshold slope was improved to the ideal value of 60 mV per decade. Studies of strained SiGe planar devices showed that subthreshold slopes of 66-70 mV per decade were achievable, although it should be noted that the on/off ratio of $10^2$ may already meet a lower practical limit for certain high-performance applications.

FIG. 9 shows a benchmark and comparison of these Ge/Si FETs. FIG. 9A shows intrinsic delay tau versus channel length for seven different Ge/Si nanowire devices with $HfO_2$ dielectric (open circles) and $ZrO_2$ dielectric (open squares). Data for devices A and B are included. The $I_{on}$ values were measured at $V_{g(on)}=V_T-0.7V_{dd}$. The dashed line is a fit to the data points while the solid line is the Si p-MOSFET from the literature. FIG. 9B shows intrinsic delay versus on/off ratio for the two devices in FIG. 8. Arrows indicate the values of intrinsic delay used in FIG. 9A.

The above Ge/Si NWFETs are depletion-mode devices with threshold voltages $V_T>0$, and require $V_g>V_T$ to be turned off. However, enhancement-mode FETs with $V_T<0$, which were off for $V_g=0$, were more desirable because they consumed less static power. In addition and as discussed above, obtaining the optimal device operation may depend on the full control of the threshold voltage. The top gated structure (FIG. 7C) may be used to tune $V_T$ through variations in the gate metal work function. Comparison of $I_d$-$V_g$ data recorded using Au and Al metal gates (FIG. 10A) showed a change from depletion mode, $V_T=+0.65$ V, to enhancement mode $V_T=-0.65$V, while other key device parameters remain the same. Measurements made on 68 NWFETs yielded average threshold values of 0.53±0.17 and −0.72±0.25 V for Au and Al top gates, respectively, and thus demonstrated the reproducibility of this effect in the Ge/Si NWFETs. The $V_T$ shift of 1.25 V corresponded approximately to the work function difference between Au ($\Phi_{Au}$=5.31-5.47 eV) and Al ($\Phi_{Al}$=4.28 eV) with small deviations attributable to metal/dielectric interface states. More generally, these results indicated that it is possible to tune $V_T$ for specific applications simply through a choice of top gate metal with specific work function in fabrication.

The Ge/Si NWFETs also exhibited an increase in $I_d$ when $V_g$ is increased to larger positive values (for example, FIG. 8) owing to conduction by electron carriers (versus holes). To address this issue, devices with asymmetrical partial gates were characterized (FIG. 10B). Data recorded from a NWFET with bias voltage applied to contact 1 (proximal to the gate) and holding contact 2 at ground (FIG. 10C), $V_{ds}=V_{12}$, showed ambipolar conduction like the fully gated device in FIG. 8. Significantly, switching the source and drain electrodes ($V_{ds}=V_{21}$) suppressed the ambipolar current from 300 to 0.8 nA at $V_{ds}=-1$ V (FIG. 10D). These results can be explained by the corresponding band diagrams (insets, FIGS. 10C and 10D). In the first case, electron injection at the drain increased with increasing $V_g$ and ultimately dominated the current, while in the second, the ungated region near contact 2 acted as a thick barrier to electron transport and suppressed electron current even at large downward bending of the conduction band.

The reduction in ambipolar current using this device structure did not appear to limit other key NWFET characteristics. The on state conductance and transconductance (FIG. 10E) showed no degradation compared to fully gated devices with similar dimensions (for example, FIG. 10A), and S (FIG. 10D) showed little $V_{ds}$ dependence, indicating good gate control. These observations contrasted with experiments on CNTFETs with similar gate structures, which may have been limited by the presence of Schottky barriers at the CNT contacts. Such limitations do not exist for Ge/Si NWFETs, which do not have contact barriers, and thus the asymmetrical gate structure can yield unipolar NWFETs without sacrificing performance.

FIG. 10 shows the control of threshold voltage and ambipolar conduction through device design. FIG. 10A shows $I_d$-$V_g$ curves for two L=300 nm devices with Au (upper) and Al (lower) top gate electrodes ($V_{ds}=-1$ V). The inset shows histogram of $V_T$ with the same $V_g$ axis for a total of 68 L=300 nm devices with Au (right) and Al (left) top gates. The solid lines correspond to Gaussian fits to the two distributions. FIG. 8B show a schematic and SEM image of the asymmetrical gate structure designed to suppress ambipolar conduction. The scale bar is 300 nm. FIG. 8C shows $I_d$-$V_g$ of a partially gated device with ambipolar conduction; bias was applied to contact 1 ($V_{ds}=V_{12}$). The inset is a schematic of band bending in the NWFET at finite bias. The arrow denotes electron injection at the drain contact. FIG. 8D shows $I_d$-$V_g$ for $V_{ds}=V_{21}$. The inset shows a schematic of band bending with electron injection denoted by arrow. The upper, middle, and lower curves in FIGS. 10C and 10D correspond to $V_{ds}$ values of −1, −0.8 and −0.6V, respectively. FIG. 8E is a linear scale $I_d$-$V_g$ ($V_{ds}=-1$ V) for the devices in FIGS. 10C and 10D. The two devices have the same peak $g_m=35$ microsiemens and $I_{d(max)}=73$ microamperes.

In summary, these examples demonstrate top-gated Ge/Si NWFET heterostructures with high-k dielectrics that exhibit scaled transconductance and on-current values of 3.3 mS micrometers$^{-1}$ and 2.1 mA micrometers$^{-1}$. In addition, the Ge/Si NWFET hole mobility was 730 cm$^2$ V$^{-1}$ s$^{-1}$. These values, together with the demonstrated control over threshold voltage and ambipolar behavior, show the ability of the Ge/Si NWFETs discussed in this example.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An electronic device, comprising:
   a nanoscale wire consisting essentially of a core consisting essentially of undoped germanium and a shell surrounding the core consisting essentially of undoped silicon, the shell in physical contact with a first contact consisting essentially of nickel metal and a second contact, wherein the shell of the nanoscale wire and the nickel metal contact form a Schottky barrier of less than 0.5 eV, and wherein the nanoscale wire exhibits ballistic transport when subjected to a voltage via the first and second contacts.

2. The electronic device of claim 1, wherein the nanoscale wire has a maximum width of less than about 500 nm.

3. An electronic device, comprising:
   an FET comprising a nanowire having a transconductance of at least about 30 microsiemens, the nanoscale wire consisting essentially of a core consisting essentially of undoped germanium and a shell surrounding the core consisting essentially of undoped silicon, the nanoscale wire being disposed between a first contact consisting essentially of nickel and a second contact, wherein the nanoscale wire exhibits ballistic transport when subjected to a voltage via the first and second contacts.

4. The electronic device of claim 3, wherein the nanowire has a transconductance of at least about 40 microsiemens.

5. The electronic device of claim 3, wherein the nanowire has a transconductance of at least about 50 microsiemens.

6. The electronic device of claim 3, wherein the nanoscale wire has a maximum width of less than about 500 nm.

7. An electronic device, comprising:
   an FET comprising a nanowire having a scaled transconductance per unit length of at least about 1 mA/micron, the nanoscale wire consisting essentially of a core consisting essentially of undoped germanium and a shell surrounding the core consisting essentially of undoped silicon, the nanoscale wire being disposed between a first contact consisting essentially of nickel and a second contact, wherein the nanoscale wire exhibits ballistic transport when subjected to a voltage via the first and second contacts.

8. The electronic device of claim 7, wherein the nanowire has a scaled transconductance of at least about 2 mA/micron.

9. The electronic device of claim 7, wherein the nanowire has a scaled transconductance of at least about 3 mA/micron.

10. The electronic device of claim 7, wherein the nanowire has a scaled transconductance of at least about 4 mA/micron.

11. The electronic device of claim 7, wherein the nanoscale wire has a maximum width of less than 500 nm.

* * * * *